(12) United States Patent
Kang et al.

(10) Patent No.: US 11,996,054 B2
(45) Date of Patent: May 28, 2024

(54) SCAN DRIVER FOR APPLYING A BIAS VOLTAGE AND DISPLAY DEVICE INCLUDING THE SAME PRELIMINARY CLASS

(71) Applicant: Samsung Display Co., Ltd., Yongin-Si (KR)

(72) Inventors: Jangmi Kang, Seoul (KR); Hyeongseok Kim, Hwaseong-si (KR); Junhyun Park, Suwon-si (KR); Minjae Jeong, Hwaseong-si (KR); Mukyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/204,395

(22) Filed: Jun. 1, 2023

(65) Prior Publication Data

US 2024/0021165 A1 Jan. 18, 2024

(30) Foreign Application Priority Data

Jul. 14, 2022 (KR) ........................ 10-2022-0087172

(51) Int. Cl.
*G09G 3/3266* (2016.01)
(52) U.S. Cl.
CPC ... *G09G 3/3266* (2013.01); *G09G 2320/0247* (2013.01)

(58) Field of Classification Search
CPC .. G09G 3/3233; G09G 3/3258; G09G 3/3266; G09G 3/3275; G09G 3/3674;
(Continued)

(56) References Cited

U.S. PATENT DOCUMENTS 8,830,156 B2 9/2014 Kim et al.
8,842,803 B2 9/2014 Jang
(Continued)

FOREIGN PATENT DOCUMENTS

KR 10-2013-0107528 A 10/2013
KR 10-2014-0020391 A 2/2014
(Continued)

*Primary Examiner* — Nelson M Rosario
(74) *Attorney, Agent, or Firm* — Innovation Counsel LLP

(57) ABSTRACT

Provided is a scan driver for applying a bias voltage comprising a $k^{th}$ stage that includes an inputter transmitting an input signal to a first node, a stress reliever disposed between the first node and a second node, a carry signal outputter receiving a high-power-supply voltage and a second clock signal and outputting the second clock signal, an output signal outputter receiving the high-power-supply voltage and a third clock signal and outputting the third clock signal, a maintainer transmitting the first clock signal to a third node, and a stabilizer applying a first low-power-supply voltage to the third node and the high-power-supply voltage to the first node. The first and second clock signals selectively toggle between the high-power-supply voltage and the first low-power-supply voltage, the third clock signal selectively toggles between the high-power-supply voltage and a second low-power-supply voltage, and the bias voltage is adjusted as the second low-power-supply voltage varies.

25 Claims, 14 Drawing Sheets

(58) Field of Classification Search
CPC ......... G09G 3/3677; G09G 2300/0814; G09G 2310/0245; G09G 2310/0286; G09G 2310/04; G09G 2310/08; G09G 2320/103; G09G 2330/021; G09G 2330/023; G09G 3/32; G09G 5/18; G09G 2230/00; G09G 2300/0452; G09G 2300/0819; G09G 2310/0262; G09G 2310/0267; G09G 2310/027; G09G 2310/0278; G09G 2310/0291; G09G 2330/028; G09G 2330/12; G09G 2370/08; G11C 19/188; G11C 19/287
See application file for complete search history.

(56)    References Cited

U.S. PATENT DOCUMENTS

2018/0233105 A1\*   8/2018   Cho ..................... G09G 3/3696
2021/0193048 A1\*   6/2021   Lim ..................... G09G 3/3275

FOREIGN PATENT DOCUMENTS

| KR | 10-2018-0059635 A | 6/2018 |
| KR | 10-2018-0072041 A | 6/2018 |

\* cited by examiner

SCAN DRIVER FOR APPLYING A BIAS VOLTAGE AND DISPLAY DEVICE INCLUDING THE SAME PRELIMINARY CLASS

CROSS-REFERENCE TO RELATED APPLICATION

This application claims priority under 35 USC § 119 to Korean Patent Application No. 10-2022-0087172 filed on Jul. 14, 2022 in the Korean Intellectual Property Office (KIPO), the entire disclosure of which is incorporated herein by reference.

BACKGROUND

1. Field

The present disclosure generally relates to a display device. More particularly, the present disclosure relates to a display device capable of applying a bias voltage to a specific node in a pixel circuit.

2. Description of the Related Art

In general, a display device may receive image data from a host processor (e.g., a graphics processing unit (GPU), etc.), and may perform a display operation based on the image data. Recently, a variable frame rate technology of matching a frame rate of an image frame (e.g., a GPU rendering speed) with a frame rate of a panel driving frame (i.e., a driving frequency of a display panel) by varying the frame rate of the panel driving frame for the display operation of the display device when the host processor varies the frame rate of the image frame constituting the image data according to characteristics of an image that is to be displayed by the display operation has been proposed.

Recently, a scheme of varying the frame rate of the panel driving frame by allowing the display device to increase or decrease a vertical blank period within the panel driving frame (e.g., to adjust the number of self scan periods performed after a display scan period) has been adopted as the variable frame rate technology. However, according to the scheme, when the frame rate of the panel driving frame decreases (i.e., when a driving time of the panel driving frame increases), flicker may occur on the display panel due to hysteresis characteristics in which characteristics of a driving transistor in a pixel circuit included in the display panel are fixed into a predetermined state during one panel driving frame.

SUMMARY

An object of the present disclosure is to provide a scan driver for applying a bias voltage, capable of applying an adjustable bias voltage to a specific node (e.g., a gate terminal of a driving transistor, and the like) in a pixel circuit included in a display panel.

Another object of the present disclosure is to provide a display device including the scan driver for applying the bias voltage.

According to embodiments, a scan driver for applying a bias voltage may include first to $n^{th}$ stages, where n is an integer of 2 or more, configured to output first to $n^{th}$ output signals for applying the bias voltage to first to $n^{th}$ pixel rows, respectively. Here, the $k^{th}$ stage, where k is an integer of 1 to n, may include an inputter configured to transmit an input signal to a first node in response to a first clock signal, a stress reliever disposed between the first node and a second node, a carry signal outputter configured to receive a high power supply voltage and a second clock signal and to output the second clock signal as a $k^{th}$ carry signal through a first output node in response to a voltage of the second node, an output signal outputter configured to receive the high power supply voltage and a third clock signal and to output the third clock signal as the $k^{th}$ output signal through a second output node in response to the voltage of the second node, a maintainer configured to transmit the first clock signal to a third node in response to a voltage of the first node, and a stabilizer configured to apply a first low power supply voltage to the third node in response to the first clock signal and to apply the high power supply voltage to the first node in response to the second clock signal. In addition, each of the first clock signal and the second clock signal may selectively toggle between the high power supply voltage and the first low power supply voltage, the third clock signal may selectively toggle between the high power supply voltage and a second low power supply voltage different from the first low power supply voltage, and the bias voltage may be adjusted by changing the second low power supply voltage.

In an embodiment, the input signal may include a scan start signal or a previous carry signal.

In an embodiment, the inputter may include a first transistor including a first terminal configured to receive the input signal, a second terminal connected to the first node, and a gate terminal configured to receive the first clock signal.

In an embodiment, the stress reliever may include an eighth transistor including a first terminal connected to the first node, a second terminal connected to the second node, and a gate terminal configured to receive the first low power supply voltage.

In an embodiment, the carry signal outputter may include a ninth transistor including a first terminal configured to receive the high power supply voltage, a second terminal connected to the first output node, and a gate terminal connected to the third node and a tenth transistor including a first terminal connected to the first output node, a second terminal configured to receive the second clock signal, and a gate terminal connected to the second node.

In an embodiment, the output signal outputter may include a sixth transistor including a first terminal configured to receive the high power supply voltage, a second terminal connected to the second output node, and a gate terminal connected to the third node and a seventh transistor including a first terminal connected to the second output node, a second terminal configured to receive the third clock signal, and a gate terminal connected to the second node.

In an embodiment, the maintainer may include a fourth transistor including a first terminal connected to the third node, a second terminal configured to receive the first clock signal, and a gate terminal connected to the first node.

In an embodiment, the stabilizer may include a second transistor including a first terminal configured to receive the high power supply voltage, a second terminal, and a gate terminal connected to the third node, a third transistor including a first terminal connected to the second terminal of the second transistor, a second terminal connected to the first node, and a gate terminal configured to receive the second clock signal, a first capacitor including a first terminal configured to receive the high power supply voltage and a second terminal connected to the third node, and a fifth transistor including a first terminal connected to the third node, a second terminal configured to receive the first low power supply voltage, and a gate terminal configured to receive the first clock signal.

In an embodiment, the scan driver may further include a bootstrapper disposed between the second node and the first output node.

In an embodiment, the bootstrapper may include a second capacitor including a first terminal connected to the second node and a second terminal connected to the first output node.

According to embodiments, a scan driver for applying a bias voltage may include first to $n^{th}$ stages, where n is an integer of 2 or more, configured to output first to $n^{th}$ output signals for applying the bias voltage to first to $n^{th}$ pixel rows, respectively. Here, the $k^{th}$ stage, where k is an integer of 1 to n, may include an inputter configured to transmit an input signal to a first node in response to a first clock signal, a stress reliever disposed between the first node and a second node, a carry signal outputter configured to receive a first high power supply voltage and a second clock signal and to output the second clock signal as a $k^{th}$ carry signal through a first output node in response to a voltage of the second node, an output signal outputter configured to receive a second high power supply voltage different from the first power supply voltage and a third clock signal and to output the third clock signal as the $k^{th}$ output signal through a second output node in response to the voltage of the second node, a maintainer configured to transmit the first clock signal to a third node in response to a voltage of the first node, and a stabilizer configured to apply a first low power supply voltage to the third node in response to the first clock signal and to apply the first high power supply voltage to the first node in response to the second clock signal. In addition, each of the first clock signal and the second clock signal may selectively toggle between the first high power supply voltage and the first low power supply voltage, the third clock signal may selectively toggle between the second high power supply voltage and a second low power supply voltage different from the first low power supply voltage, and the bias voltage may be adjusted by changing at least one of the second high power supply voltage and the second low power supply voltage or by changing the second high power supply voltage and the second low power supply voltage simultaneously.

In an embodiment, the input signal may include a scan start signal or a previous carry signal.

In an embodiment, the inputter may include a first transistor including a first terminal configured to receive the input signal, a second terminal connected to the first node, and a gate terminal configured to receive the first clock signal.

In an embodiment, the stress reliever may include an eighth transistor including a first terminal connected to the first node, a second terminal connected to the second node, and a gate terminal configured to receive the first low power supply voltage.

In an embodiment, the carry signal outputter may include a ninth transistor including a first terminal configured to receive the first high power supply voltage, a second terminal connected to the first output node, and a gate terminal connected to the third node and a tenth transistor including a first terminal connected to the first output node, a second terminal configured to receive the second clock signal, and a gate terminal connected to the second node.

In an embodiment, the output signal outputter may include a sixth transistor including a first terminal configured to receive the second high power supply voltage, a second terminal connected to the second output node, and a gate terminal connected to the third node and a seventh transistor including a first terminal connected to the second output node, a second terminal configured to receive the third clock signal, and a gate terminal connected to the second node.

In an embodiment, the maintainer may include a fourth transistor including a first terminal connected to the third node, a second terminal configured to receive the first clock signal, and a gate terminal connected to the first node.

In an embodiment, the stabilizer may include a second transistor including a first terminal configured to receive the first high power supply voltage, a second terminal, and a gate terminal connected to the third node, a third transistor including a first terminal connected to the second terminal of the second transistor, a second terminal connected to the first node, and a gate terminal configured to receive the second clock signal, a first capacitor including a first terminal configured to receive the first high power supply voltage and a second terminal connected to the third node, and a fifth transistor including a first terminal connected to the third node, a second terminal configured to receive the first low power supply voltage, and a gate terminal configured to receive the first clock signal.

In an embodiment, the scan driver may further include a bootstrapper disposed between the second node and the first output node.

In an embodiment, the bootstrapper may include a second capacitor including a first terminal connected to the second node and a second terminal connected to the first output node.

According to embodiments, a display device may include a display panel including first to $n^{th}$ pixel rows, where n is an integer of 2 or more, including pixel circuits having a structure in which a bias voltage is applied to a gate terminal of a driving transistor through a boosting capacitor, a display panel driver configured to drive the display panel, and a scan driver for applying a bias voltage, which includes first to $n^{th}$ stages configured to output first to $n^{th}$ output signals for applying the bias voltage to the first to $n^{th}$ pixel rows, respectively. Here, the bias voltage may correspond to a difference between a high-level voltage and a low-level voltage of the $k^{th}$ output signal, where k is an integer of 1 to n, and the bias voltage may be adjusted by changing at least one of the high-level voltages and the low-level voltage or by changing the high-level voltage and the low-level voltage simultaneously.

In an embodiment, the $k^{th}$ stage may include an inputter configured to transmit an input signal to a first node in response to a first clock signal, a stress reliever disposed between the first node and a second node, a carry signal outputter configured to receive a high power supply voltage and a second clock signal and to output the second clock signal as a $k^{th}$ carry signal through a first output node in response to a voltage of the second node, an output signal outputter configured to receive the high power supply voltage and a third clock signal and to output the third clock signal as the $k^{th}$ output signal through a second output node in response to the voltage of the second node, a maintainer configured to transmit the first clock signal to a third node in response to a voltage of the first node, and a stabilizer configured to apply a first low power supply voltage to the third node in response to the first clock signal and to apply the high power supply voltage to the first node in response to the second clock signal. In addition, each of the first clock signal and the second clock signal may toggle between the high power supply voltage and the first low power supply voltage, the third clock signal may toggle between the high power supply voltage and a second low power supply voltage different from the first low power supply voltage, and the bias voltage may be adjusted by changing the second low power supply voltage.

In an embodiment, the input signal may include a scan start signal or a previous carry signal.

In an embodiment, the $k^{th}$ stage may include an inputter configured to transmit an input signal to a first node in response to a first clock signal, a stress reliever disposed between the first node and a second node, a carry signal outputter configured to receive a first high power supply voltage and a second clock signal and to output the second clock signal as a $k^{th}$ carry signal through a first output node in response to a voltage of the second node, an output signal outputter configured to receive a second high power supply voltage and a third clock signal and to output the third clock signal as the $k^{th}$ output signal through a second output node in response to the voltage of the second node, a maintainer configured to transmit the first clock signal to a third node in response to a voltage of the first node, and a stabilizer configured to apply a first low power supply voltage to the third node in response to the first clock signal and to apply the first high power supply voltage to the first node in response to the second clock signal. In addition, each of the first clock signal and the second clock signal may toggle between the first high power supply voltage and the first low power supply voltage, the third clock signal may toggle between the second high power supply voltage and a second low power supply voltage different from the first low power supply voltage, and the bias voltage may be adjusted as at least one of the second high power supply voltage and the second low power supply voltage or by changing the second high power supply voltage and the second low power supply voltage simultaneously.

In an embodiment, the input signal may include a scan start signal or a previous carry signal.

Therefore, a scan driver for applying a bias voltage according to embodiments may include first to $n^{th}$ stages configured to output first to $n^{th}$ output signals for applying the bias voltage to first to n pixel rows, respectively. Here, the bias voltage may be variously adjusted by varying a high-level voltage and/or a low-level voltage of each of the first to $n^{th}$ output signals.

The $k^{th}$ stage among the first to $n^{th}$ stages may include an inputter configured to transmit an input signal to a first node in response to a first clock signal, a stress reliever disposed between the first node and a second node, a carry signal outputter configured to receive a high power supply voltage and a second clock signal and to output the second clock signal as a $k^{th}$ carry signal through a first output node in response to a voltage of the second node, an output signal outputter configured to receive the high power supply voltage and a third clock signal and to output the third clock signal as the $k^{th}$ output signal through a second output node in response to the voltage of the second node, a maintainer configured to transmit the first clock signal to a third node in response to a voltage of the first node, and a stabilizer configured to apply a first low power supply voltage to the third node in response to the first clock signal and to apply the high power supply voltage to the first node in response to the second clock signal. Here, each of the first clock signal and the second clock signal may toggle between the high power supply voltage and the first low power supply voltage, the third clock signal may toggle between the high power supply voltage (i.e., the high-level voltage of the $k^{th}$ output signal) and a second low power supply voltage (i.e., the low-level voltage of the $k^{th}$ output signal), and the bias voltage may be adjusted as the second low power supply voltage varies. Accordingly, even when a frame rate of a panel driving frame for driving a display panel varies (i.e., a driving frequency of the display panel varies), hysteresis characteristics in which characteristics of a driving transistor are fixed into a predetermined state can be improved.

Alternatively, the $k^{th}$ stage among the first to $n^{th}$ stages may include an inputter configured to transmit an input signal to a first node in response to a first clock signal, a stress reliever disposed between the first node and a second node, a carry signal outputter configured to receive a first high power supply voltage and a second clock signal and to output the second clock signal as a $k^{th}$ carry signal through a first output node in response to a voltage of the second node, an output signal outputter configured to receive a second high power supply voltage different from the first high power supply voltage and a third clock signal and to output the third clock signal as the $k^{th}$ output signal through a second output node in response to the voltage of the second node, a maintainer configured to transmit the first clock signal to a third node in response to a voltage of the first node, and a stabilizer configured to apply a first low power supply voltage to the third node in response to the first clock signal and to apply the first high power supply voltage to the first node in response to the second clock signal. Here, each of the first clock signal and the second clock signal may toggle between the first high power supply voltage and the first low power supply voltage, the third clock signal may toggle between the second high power supply voltage (i.e., the high-level voltage of the $k^{th}$ output signal) and a second low power supply voltage (i.e., the low-level voltage of the $k^{th}$ output signal), and the bias voltage may be adjusted as at least one of the second high power supply voltage and the second low power supply voltage varies. Accordingly, even when a frame rate of a panel driving frame for driving a display panel varies, hysteresis characteristics in which characteristics of a driving transistor are fixed into a predetermined state can be improved.

In addition, a display device according to embodiments may include the scan driver for applying the bias voltage, so that a high-quality image can be displayed even when a variable frame rate technology is adopted.

DETAILED DESCRIPTION OF THE EMBODIMENTS

Hereinafter, embodiments of the present disclosure will be explained in detail with reference to the accompanying drawings.

Figure 1:
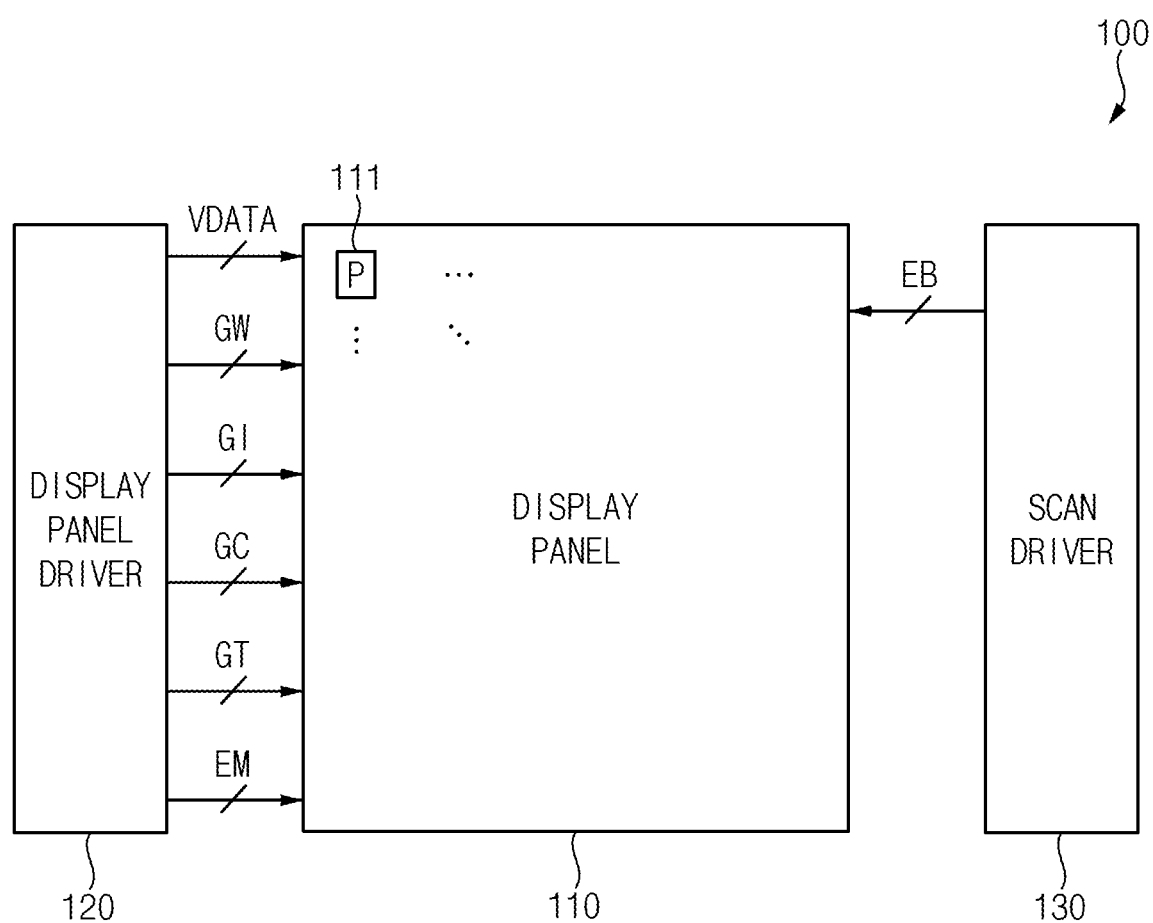
FIG. 1 is a block diagram illustrating a display device according to embodiments.
Figure 2:
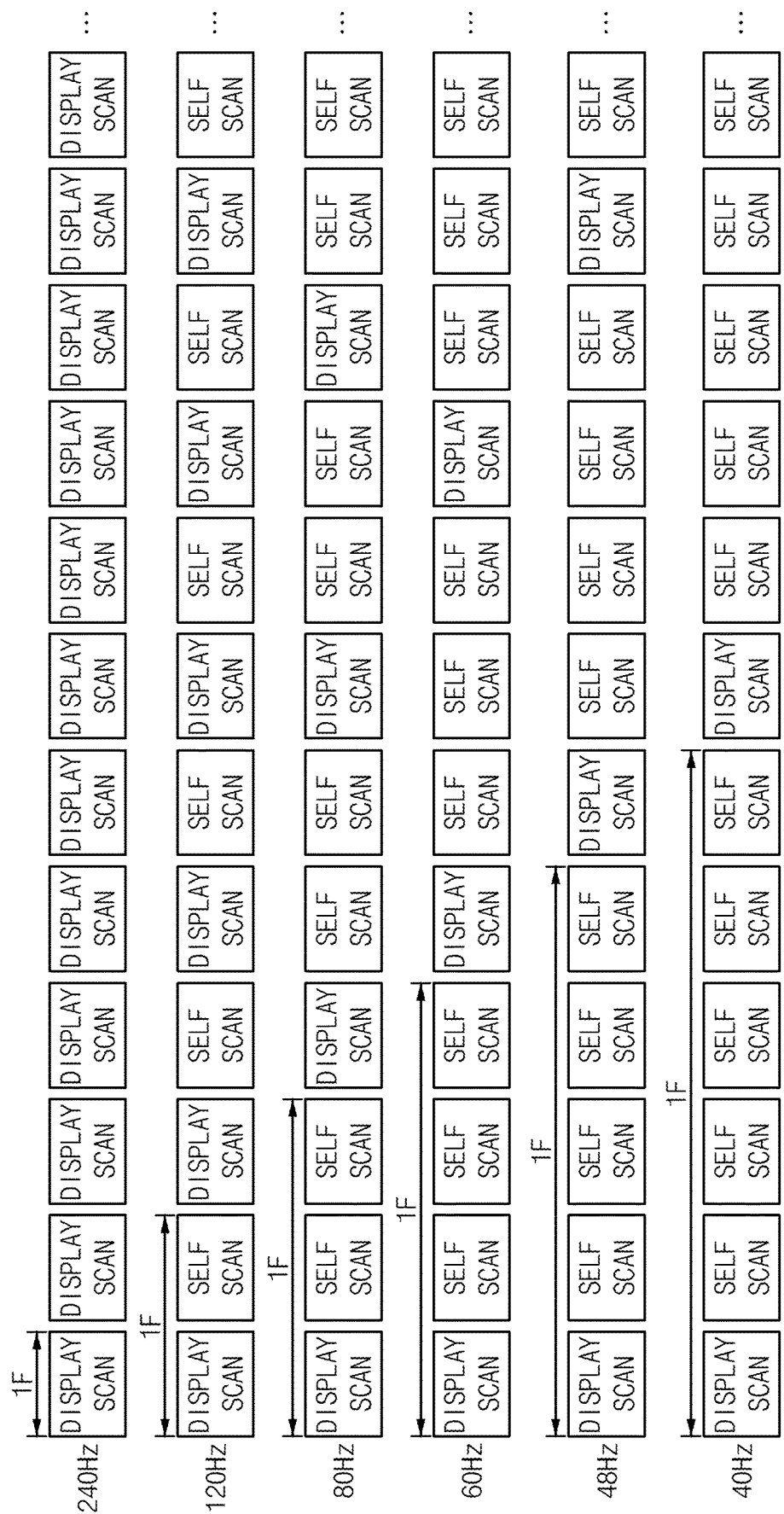
FIG. 2 is a diagram for describing that the display device of FIG. 1 varies a frame rate of a panel driving frame.

FIG. 1 is a block diagram illustrating a display device according to embodiments, and FIG. 2 is a diagram for describing that the display device of FIG. 1 varies a frame rate of a panel driving frame.

Referring to FIGS. 1 and 2, a display device 100 may include a display panel 110, a display panel driver 120, and a scan driver 130 for applying a bias voltage. Here, the display device 100 may display an image at various driving frequencies (i.e., drive the display panel 110 at various driving frequencies) according to driving conditions. Meanwhile, although the display panel driver 120 and the scan driver 130 for applying the bias voltage have been shown in FIG. 1 as separate components, the scan driver 130 for applying the bias voltage may be a component included in the display panel driver 120. In some embodiments, the display device 100 may be an organic light emitting display device or a quantum dot light emitting display device, but the display device 100 is not limited thereto.

The display panel 110 may include a plurality of pixel circuits 111. For example, the pixel circuits 111 may include a red pixel circuit, a green pixel circuit, and a blue pixel circuit. Here, each of the pixel circuits 111 may be connected to a data line configured to transmit a data signal VDATA (i.e., a data voltage), a gate line configured to transmit a gate signal GW, an initialization line configured to transmit an initialization signal GI, a compensation line configured to transmit a compensation signal GC, a connection line configured to transmit a connection signal GT, an emission line configured to transmit an emission signal EM, and a bias line configured to transmit an output signal EB for applying the bias voltage.

The pixel circuit 111 may perform one display scan operation (i.e., denoted by a display scan period DISPLAY SCAN in FIG. 2) when a driving time of a panel driving frame for driving the display panel 110 is a reference driving time (or a minimum driving time), and may perform one display scan operation and at least one self scan operation (i.e., denoted by a self scan period SELF SCAN in FIG. 2) when the driving time of the panel driving frame for driving the display panel 110 is greater than the reference driving time. Here, the display scan operation may be an operation of receiving the data signal VDATA to allow a light emitting element (e.g., an organic light emitting diode) to emit a light, and the self scan operation may be an operation of changing characteristics of a driving transistor included in the pixel circuit 111. In an embodiment, the pixel circuit 111 may separately perform a compensation operation and a data writing operation. To accomplish this end, the pixel circuit 111 may have a so-called 9T-3C structure including nine transistors and three capacitors. However, the above configuration will be described in detail with reference to FIGS. 3 and 4.

The pixel circuit 111 may have a structure in which the bias voltage is applied to a gate terminal of the driving transistor through a boosting capacitor. A plurality of pixel circuits 111 may constitute first to $n^{th}$ pixel rows (where n is an integer of 2 or more) in the display panel 110. Here, the output signal EB for applying the bias voltage may be sequentially provided to the first to $n^{th}$ pixel rows by the scan driver 130 for applying the bias voltage. For example, after a $k^{th}$ output signal EB(k) (where k is an integer of 1 to n) is provided to the $k^{th}$ pixel row, a $(k+1)^{th}$ output signal EB(k+1) may be provided to the $(k+1)^{th}$ pixel row. Here, a time interval of one horizontal period 1H may exist between a time point at which the scan driver 130 for applying the bias voltage outputs the $k^{th}$ output signal EB(k) to the $k^{th}$ pixel row and a time point at which the scan driver 130 for applying the bias voltage outputs the $(k+1)^{th}$ output signal EB(k+1) to the (k+1)th pixel row.

The display panel driver 120 may drive the display panel 110. In an embodiment, the display panel driver 120 may include a data driver configured to provide the data signal VDATA to the display panel 110 through the data line, a gate driver configured to provide the gate signal GW to the display panel 110 through the gate line, an initialization driver configured to provide the initialization signal GI to the display panel 110 through the initialization line, a compensation driver configured to provide the compensation signal GC to the display panel 110 through the compensation line, a connection driver configured to provide the connection signal GT to the display panel 110 through the connection line, an emission driver configured to provide the emission signal EM to the display panel 110 through the emission line, and a timing controller (also referred to as a display panel driving controller) configured to control the data driver, the gate driver, the initialization driver, the compensation driver, the connection driver, and the emission driver.

The timing controller may receive image data from a host processor (e.g., a graphic processing unit, etc.) through a predetermined interface. For example, the image data may include red image data, green image data, and blue image data. In some embodiments, the image data may further include white image data. As another example, the image data may include magenta image data, yellow image data, and cyan image data. The timing controller may provide the image data received from the host processor to the data driver, or may perform predetermined processing (e.g., luminance compensation, degradation compensation, etc.) on the image data received from the host processor and provide compensated image data to the data driver.

The data driver may provide the data signal VDATA to the display panel 110 through the data line. In detail, the data driver may generate the data signal VDATA (i.e., the data voltage) by converting digital image data (or the compensated image data) into an analog voltage based on the image data (or the compensated image data) received from the timing controller and a predetermined control signal (e.g., a horizontal start signal, a load signal, etc.), and may provide the data signal VDATA to the pixel circuits 111 included in the display panel 110.

The gate driver may provide the gate signal GW to the display panel 110 through the gate line. In detail, the gate driver may generate the gate signal GW based on a predetermined control signal (e.g., a vertical start signal, a gate clock signal, etc.) received from the timing controller, and may provide the gate signal GW to the pixel circuits 111 included in the display panel 110.

The initialization driver may provide the initialization signal GI to the display panel 110 through the initialization line. In detail, the initialization driver may generate the initialization signal GI based on a predetermined control signal received from the timing controller, and may provide the initialization signal GI to the pixel circuits 111 included in the display panel 110.

The compensation driver may provide the compensation signal GC to the display panel 110 through the compensation line. In detail, the compensation driver may generate the compensation signal GC based on a predetermined control signal received from the timing controller, and may provide the compensation signal GC to the pixel circuits 111 included in the display panel 110.

The connection driver may provide the connection signal GT to the display panel 110 through the connection line. In detail, the connection driver may generate the connection signal GT based on a predetermined control signal received from the timing controller, and may provide the connection signal GT to the pixel circuits 111 included in the display panel 110.

The emission driver may provide the emission signal EM to the display panel 110 through the emission line. In detail, the emission driver may generate the emission signal EM based on a predetermined control signal received from the timing controller, and may provide the emission signal EM to the pixel circuits 111 included in the display panel 110.

In some embodiments, some of the gate signal GW, the initialization signal GI, the compensation signal GC, the connection signal GT, and the emission signal EM may be omitted. In this case, a predetermined signal for performing a specific operation on a specific pixel row may be used to perform another specific operation on another specific pixel row. For example, a gate signal GW applied to a specific pixel row may be used as an initialization signal GI for another specific pixel row. Here, some of the gate driver, the initialization driver, the compensation driver, the connection driver, and the emission driver may be omitted in the display panel driver 120.

The scan driver 130 for applying the bias voltage may include first to $n^{th}$ stages configured to output the output signal EB for applying the bias voltage to the first to $n^{th}$ pixel rows included in the display panel 110, respectively. Here, a bias voltage applied to a specific pixel row may correspond to a difference between a high-level voltage and a low-level voltage of the output signal EB output from the scan driver 130 for applying the bias voltage. Accordingly, the bias voltage applied to the specific pixel row may be variously adjusted as the high-level voltage and/or the low-level voltage of the output signal EB output from the scan driver 130 for applying the bias voltage varies. However, the above configuration will be described in detail with reference to FIGS. 7 to 14.

As described above, the display device 100 may allow the light emitting element included in the pixel circuit 111 to emit a light in the display scan period DISPLAY SCAN, and may change the characteristics of the driving transistor included in the pixel circuit 111 in the self scan period SELF SCAN. For example, as shown in FIG. 2, the display device 100 may perform only one display scan period DISPLAY SCAN at a maximum driving frequency of the display panel 110 (i.e., it is assumed in FIG. 2 that the maximum driving frequency of the display panel 110 is 240 Hz), and may perform one display scan period DISPLAY SCAN and at least one self scan period SELF SCAN at driving frequencies other than the maximum driving frequency of the display panel 110 (i.e., 120 Hz, 80 Hz, 60 Hz, 48 Hz, 40 Hz, etc.).

In detail, one panel driving frame 1F may include only one display scan period DISPLAY SCAN when the driving frequency of the display panel 110 is 240 Hz, one panel driving frame 1F may include one display scan period DISPLAY SCAN and one self scan period SELF SCAN when the driving frequency of the display panel 110 is 120 Hz, one panel driving frame 1F may include one display scan period DISPLAY SCAN and two self scan periods SELF SCAN when the driving frequency of the display panel 110 is 80 Hz, one panel driving frame 1F may include one display scan period DISPLAY SCAN and three self scan periods SELF SCAN when the driving frequency of the display panel 110 is 60 Hz, one panel driving frame 1F may include one display scan period DISPLAY SCAN and four self scan periods SELF SCAN when the driving frequency of the display panel 110 is 48 Hz, and one panel driving frame 1F may include one display scan period DISPLAY SCAN and five self scan periods SELF SCAN when the driving frequency of the display panel 110 is 40 Hz. As described above, the display device 100 may vary the driving frequency of the display panel 110 by adjusting the number of self scan intervals SELF SCAN.

Figure 3:
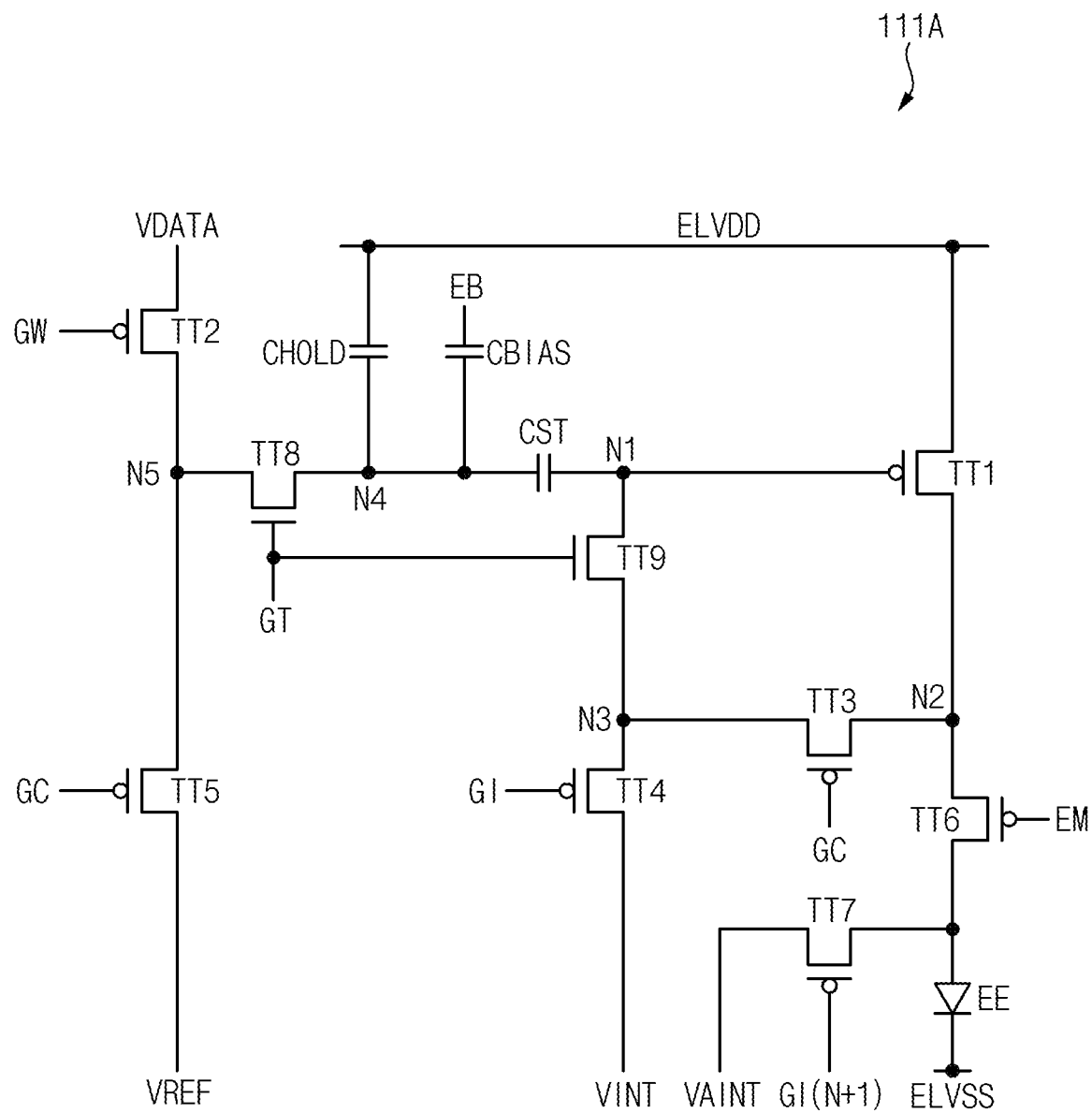
FIG. 3 is a circuit diagram illustrating an example of a pixel circuit included in the display device of FIG. 1.

FIG. 3 is a circuit diagram illustrating an example of a pixel circuit included in the display device of FIG. 1.

Referring to FIG. 3, a pixel circuit 111A may have a so-called 9T-3C structure in which a compensation operation and a data writing operation are separately performed. In detail, the pixel circuit 111A may include a light emitting element EE, a first thin film transistor TT1, a second thin film transistor TT2, a third thin film transistor TT3, a fourth thin film transistor TT4, a fifth thin film transistor TT5, a sixth thin film transistor TT6, a seventh thin film transistor TT7, an eighth thin film transistor TT8, a ninth thin film transistor TT9, a storage capacitor CST, a hold capacitor CHOLD, and a bias capacitor CBIAS.

The first thin film transistor TT1 may include a gate terminal connected to a first pixel node N1, a first terminal configured to receive a first power supply voltage ELVDD, and a second terminal connected to a second pixel node N2. Here, the first thin film transistor TT1 may be turned on in response to a voltage stored in the storage capacitor CST (i.e., a voltage of the first pixel node N1) to allow a driving current to flow to the light emitting element EE. In other words, the first thin film transistor TT1 may be referred to as a driving transistor. Meanwhile, a bias voltage corresponding to the difference between the high-level voltage and the low-level voltage of the output signal EB output from the scan driver 130 for applying the bias voltage may be applied indirectly (i.e., via the storage capacitor CST) to the gate terminal (i.e., the first pixel node N1) of the first thin film transistor TT1.

The second thin film transistor TT2 may include a gate terminal configured to receive the gate signal GW, a first terminal connected to the data line configured to transmit the data signal VDATA, and a second terminal connected to a fifth pixel node N5. Here, the second thin film transistor TT2 may be turned on in response to the gate signal GW to apply the data signal VDATA transmitted through the data line to a fourth pixel node N4 via the eighth thin film transistor TT8.

The third thin film transistor TT3 may include a gate terminal configured to receive the compensation signal GC, a first terminal connected to the second pixel node N2, and a second terminal connected to a third pixel node N3. Here, the third thin film transistor TT3 may be turned on in response to the compensation signal GC to diode-connect the first thin film transistor TT1 via the ninth thin film transistor TT9 so as to compensate a threshold voltage of the first thin film transistor TT1, that is, the driving transistor.

The fourth thin film transistor TT4 may include a gate terminal configured to receive the initialization signal GI, a first terminal connected to the third pixel node N3, and a second terminal configured to receive an initialization voltage VINT. Here, the fourth thin film transistor TT4 may be turned on in response to the initialization signal GI to apply the initialization voltage VINT to the first pixel node N1 via the ninth thin film transistor TT9. Accordingly, the gate terminal (i.e., the first pixel node N1) of the first thin film transistor TT1, that is, the driving transistor may be initialized.

The fifth thin film transistor TT5 may include a gate terminal configured to receive the compensation signal GC, a first terminal connected to the fifth pixel node N5, and a second terminal configured to receive a reference voltage VREF. Here, the fifth thin film transistor TT5 may be turned on in response to the compensation signal GC to apply the reference voltage VREF to the fourth pixel node N4 via the eighth thin film transistor TT8. In an embodiment, the reference voltage VREF may be the first power supply voltage ELVDD.

The sixth thin film transistor TT6 may include a gate terminal configured to receive the emission signal EM, a first terminal connected to the second pixel node N2, and a second terminal connected to an anode of the light emitting element EE. Here, the sixth thin film transistor TT6 may be turned on in response to the emission signal EM to allow the driving current to flow to the light emitting element EE between the first power supply voltage ELVDD and a second power supply voltage ELVSS.

The seventh thin film transistor TT7 may include a gate terminal configured to receive a next initialization signal GI(N+1), a first terminal connected to the anode of the light emitting element EE, and a second terminal configured to receive a reset voltage VAINT. Here, the seventh thin film transistor TT7 may be turned on in response to the next initialization signal GI(N+1) to apply the reset voltage VAINT to the anode of the light emitting element EE. Accordingly, the anode of the light emitting element EE may be reset (or initialized). In some embodiments, a separate reset signal may be applied to the gate terminal of the seventh thin film transistor TT7 instead of the next initialization signal GI(N+1). In this case, the display panel driver 120 may further include a reset driver configured to generate a separate reset signal.

In an embodiment, the initialization voltage VINT applied to the first pixel node N1 via the fourth thin film transistor TT4 and the reset voltage VAINT applied to the anode of the light emitting element EE via the seventh thin film transistor TT7 may be the same. In another embodiment, the initialization voltage VINT applied to the first pixel node N1 via the fourth thin film transistor TT4 and the reset voltage VAINT applied to the anode of the light emitting element EE via the seventh thin film transistor TT7 may be different from each other.

The eighth thin film transistor TT8 may include a gate terminal configured to receive the connection signal GT, a first terminal connected to the fifth pixel node N5, and a second terminal connected to the fourth pixel node N4. Here, the eighth thin film transistor TT8 may be turned on in response to the connection signal GT to electrically connect the fifth pixel node N5 to the fourth pixel node N4. Meanwhile, when the eighth thin film transistor TT8 is turned off in response to the connection signal GT, the fifth pixel node N5 and the fourth pixel node N4 may be electrically disconnected from each other.

The ninth thin film transistor TT9 may include a gate terminal configured to receive the connection signal GT, a first terminal connected to the first pixel node N1, and a second terminal connected to the third pixel node N3. Here, the ninth thin film transistor TT9 may be turned on in response to the connection signal GT to electrically connect the first pixel node N1 to the third pixel node N3. Meanwhile, when the ninth thin film transistor TT9 is turned off in response to the connection signal GT, the first pixel node N1 and the third pixel node N3 may be electrically disconnected from each other.

The storage capacitor CST may include a first terminal connected to the fourth pixel node N4 and a second terminal connected to the first pixel node N1. Here, the storage capacitor CST may store a voltage generated by performing threshold voltage compensation on the data signal VDATA (i.e., the data voltage) transmitted through the data line.

The hold capacitor CHOLD may include a first terminal configured to receive the first power supply voltage ELVDD and a second terminal connected to the fourth pixel node N4 (i.e., the first terminal of the storage capacitor CST). Here, the hold capacitor CHOLD may perform a holding operation for a voltage of the fourth pixel node N4.

The bias capacitor CBIAS may include a first terminal configured to receive the output signal EB output from the scan driver for applying the bias voltage and a second terminal connected to the fourth pixel node N4. Here, the bias capacitor CBIAS may perform a boosting operation with the bias voltage corresponding to the difference between the high-level voltage and the low-level voltage of the output signal EB output from the scan driver 130 for applying the bias voltage. Accordingly, the voltage of the fourth pixel node N4 may be boosted by the bias voltage corresponding to the difference between the high-level voltage and the low-level voltage of the output signal EB output from the scan driver 130 for applying the bias voltage, so that a voltage of the gate terminal (i.e., the first pixel node N1) of the first thin film transistor TT1 may also be indirectly boosted through the storage capacitor CST. Here, the scan driver 130 for applying the bias voltage may adjust the bias voltage by varying the high-level voltage and/or the low-level voltage of the output signal EB.

The light emitting element EE may include an anode connected to the second terminal of the sixth thin film transistor TT6 and the first terminal of the seventh thin film transistor TT7, and a cathode configured to receive the second power supply voltage ELVSS. Here, the light emitting element EE may emit a light corresponding to the driving current controlled by the first thin film transistor TT1, which is the driving transistor. In an embodiment, when the display device 100 is an organic light emitting display device, the light emitting element EE may be an organic light emitting diode. However, the light emitting element EE is not limited thereto.

Meanwhile, although it has been shown in FIG. 3 that the first thin film transistor TT1, the second thin film transistor TT2, the third thin film transistor TT3, the fourth thin film transistor TT4, the fifth thin film transistor TT5, the sixth thin film transistor TT6, and the seventh thin film transistor TT7 are p-channel metal oxide semiconductor (PMOS) transistors, and the eighth thin film transistor TT8 and the ninth thin film transistor TT9 are n-channel metal oxide semiconductor (NMOS) transistors, in some embodiments, it is to be understood that each of the first to ninth thin film transistors TT1 to TT9 may be selectively implemented as PMOS transistors or NMOS transistors.

Figure 4:
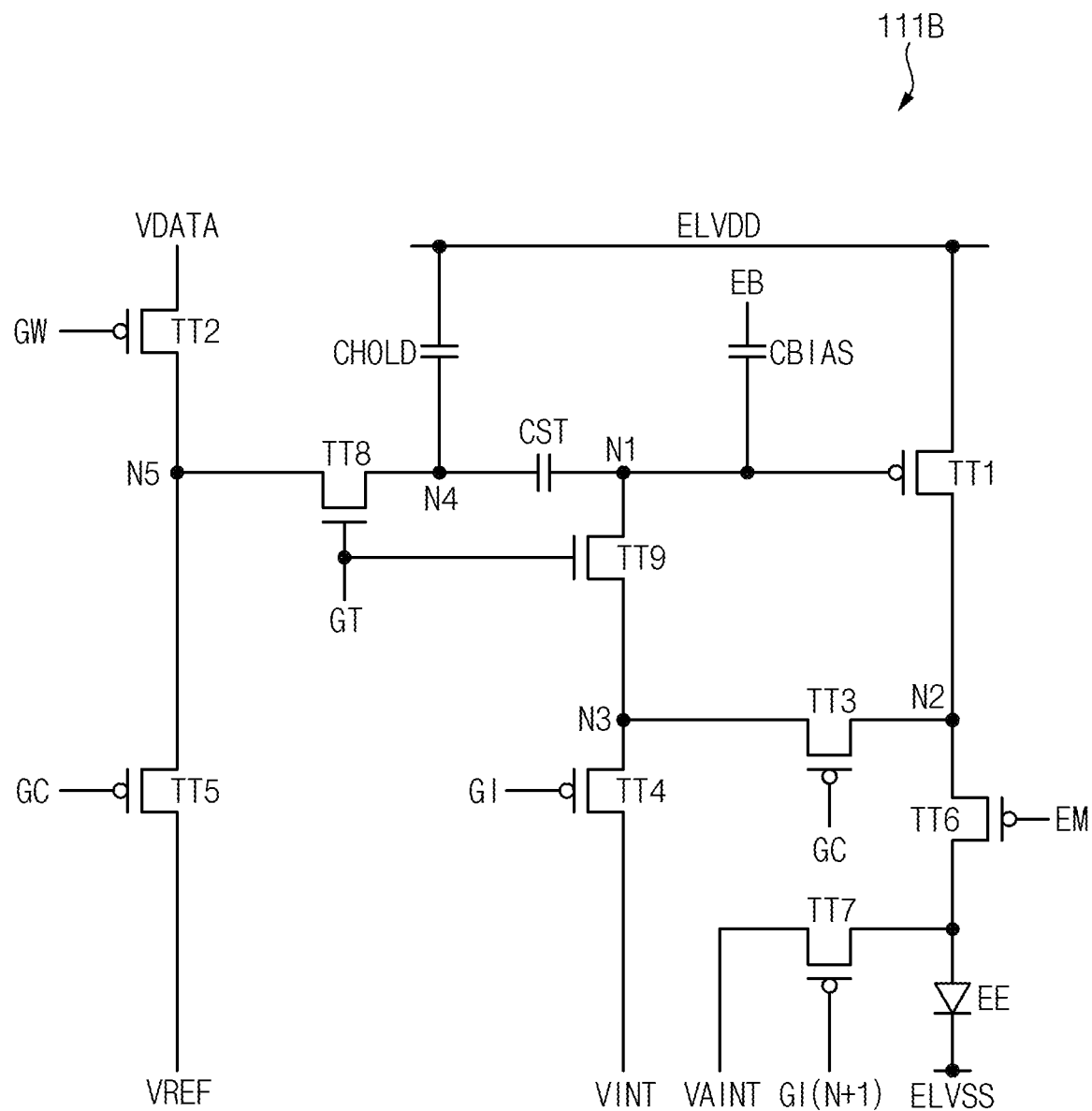
FIG. 4 is a circuit diagram illustrating another example of a pixel circuit included in the display device of FIG. 1.

FIG. 4 is a circuit diagram illustrating another example of a pixel circuit included in the display device of FIG. 1.

Referring to FIG. 4, a pixel circuit 111B may have a so-called 9T-3C structure in order to separately perform a compensation operation and a data writing operation. In detail, the pixel circuit 111B may include a light emitting element EE, a first thin film transistor TT1, a second thin film transistor TT2, a third thin film transistor TT3, a fourth thin film transistor TT4, a fifth thin film transistor TT5, a sixth thin film transistor TT6, a seventh thin film transistor TT7, an eighth thin film transistor TT8, a ninth thin film transistor TT9, a storage capacitor CST, a hold capacitor CHOLD, and a bias capacitor CBIAS. However, a structure of the pixel circuit 111B of FIG. 4 may be identical to the structure of the pixel circuit 111A of FIG. 3 except that the bias capacitor CBIAS is directly connected to the gate terminal of the driving transistor, that is, the first thin film transistor TT1. While describing the pixel circuit 111B of FIG. 4, redundant descriptions corresponding to the pixel circuit 111A of FIG. 3 will be omitted.

As shown in FIG. 4, the bias capacitor CBIAS may include a first terminal configured to receive the output signal EB output from the scan driver for applying the bias voltage and a second terminal connected to the first pixel node N1. Here, the bias capacitor CBIAS may perform a boosting operation with the bias voltage corresponding to the difference between the high-level voltage and the low-level voltage of the output signal EB output from the scan driver 130 for applying the bias voltage. Meanwhile, since the bias capacitor CBIAS is directly connected to the first pixel node N1, the voltage of the first pixel node N1 may be directly boosted. Accordingly, the voltage of the first pixel node N1 may be directly boosted by the bias voltage corresponding to the difference between the high-level voltage and the low-level voltage of the output signal EB output from the scan driver 130 for applying the bias voltage. Here, the scan driver 130 for applying the bias voltage may adjust the bias voltage by varying the high-level voltage and/or the low-level voltage of the output signal EB.

Meanwhile, although it has been also shown in FIG. 4 that the first thin film transistor TT1, the second thin film transistor TT2, the third thin film transistor TT3, the fourth thin film transistor TT4, the fifth thin film transistor TT5, the sixth thin film transistor TT6, and the seventh thin film transistor TT7 are PMOS transistors, and the eighth thin film transistor TT8 and the ninth thin film transistor TT9 are NMOS transistors, in some embodiments, it is to be understood that each of the first to ninth thin film transistors TT1 to TT9 may be selectively implemented as PMOS transistors or NMOS transistors.

Figure 5:
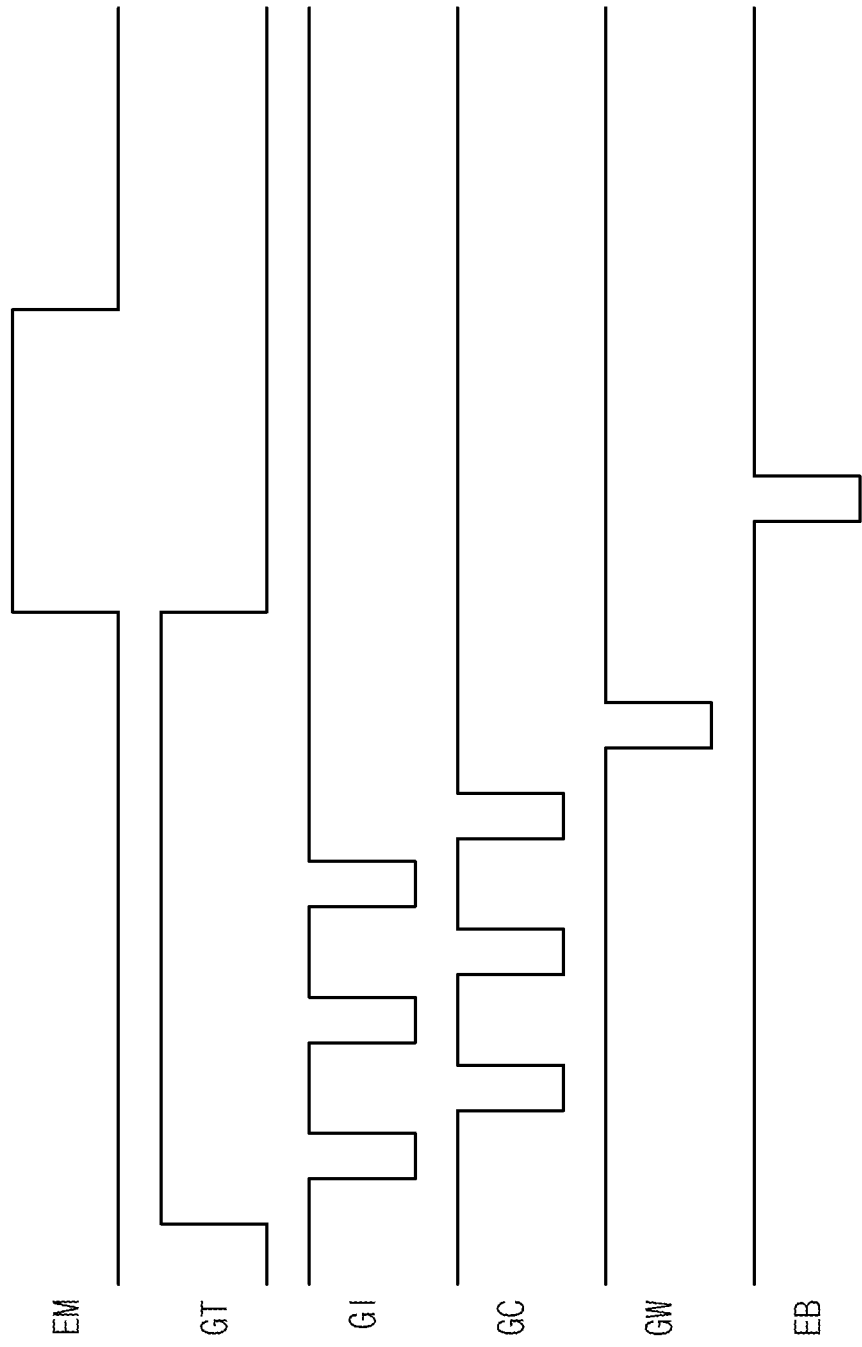
FIG. 5 is a timing diagram illustrating signals applied to the pixel circuit of FIG. 3 or the pixel circuit of FIG. 4 in a display scan period.

FIG. 5 is a timing diagram illustrating signals applied to the pixel circuit of FIG. 3 or the pixel circuit of FIG. 4 in a display scan period.

Referring to FIG. 5, the signals EM, GT, GI, GC, GW, and EB applied to the pixel circuits 111A and 111B when the pixel circuits 111A and 111B perform the display scan operation in the display scan period DISPLAY SCAN have been shown in the drawing.

The emission signal EM may include a turn-on voltage period (i.e., a low-level voltage in FIG. 5) and a turn-off voltage period (i.e., a high-level voltage in FIG. 5) in the display scan period DISPLAY SCAN in which the pixel circuits 111A and 111B perform the display scan operation. The sixth thin film transistor TT6 may be turned off in the turn-off voltage period in which the emission signal EM has the high-level voltage. Meanwhile, the sixth thin film transistor TT6 may be turned on in the turn-on voltage period in which the emission signal EM has the low-level voltage.

The connection signal GT may also have a turn-on voltage period (i.e., a high-level voltage in FIG. 5) in a former turn-on voltage period in which the emission signal EM has the low-level voltage. In other words, in the former turn-on voltage period in which the emission signal EM has the low-level voltage, the eighth thin film transistor TT8 and the ninth thin film transistor TT9 may be turned on, so that the fifth pixel node N5 and the fourth pixel node N4 may be electrically connected to each other, and the first pixel node N1 and the third pixel node N3 may also be electrically connected to each other.

In addition, in the former turn-on voltage period in which the emission signal EM has the low-level voltage, the initialization signal GI may have a turn-on voltage period (i.e., three low-level voltages in FIG. 5), the compensation signal GC may also have a turn-on voltage period (i.e., three low-level voltages in FIG. 5), and the gate signal GW may also have a turn-on voltage period (i.e., one low-level voltage in FIG. 5). In other words, while the eighth thin film transistor TT8 and the ninth thin film transistor TT9 are turned on, an initialization operation, a compensation operation, and a data writing operation of the pixel circuits 111A and 111B may be sequentially performed. Here, since the compensation operation corresponding to the turn-on voltage period of the compensation signal GC and the data writing operation corresponding to the turn-on voltage period of the gate signal GW are not simultaneously performed, the compensation operation and the data writing operation may be separately performed in the pixel circuits 111A and 111B.

In detail, in the former turn-on voltage period in which the emission signal EM has the low-level voltage, when the initialization signal GI is in the turn-on voltage period (i.e., the three low-level voltages in FIG. 5), the fourth thin film transistor TT4 may be turned on so that the initialization voltage VINT may be applied to the first pixel node N1 via the ninth thin film transistor TT9 (at this time, the ninth thin film transistor TT9 has been turned on in response to the connection signal GT). In other words, the first pixel node N1 (i.e., the gate terminal of the first thin film transistor TT1, which is the driving transistor) may be initialized by the initialization operation. Meanwhile, although the pixel circuits 111A and 111B have been shown in FIG. 5 to perform three initialization operations, the number of initialization operations is not limited thereto.

Meanwhile, when the next initialization signal GI(N+1) is in the turn-on voltage period, the seventh thin film transistor TT7 may be turned on so that the reset voltage VAINT may be applied to the anode of the light emitting element EE. In other words, the anode of the light emitting element EE may be reset (or initialized) by a reset operation. Meanwhile, since the pixel circuits 111A and 111B have been shown in FIG. 5 to perform three initialization operations, three reset operations may also be performed based on the next initialization signal GI(N+1), but the number of reset operations is not limited thereto. As described above, in some embodiments, the display device 100 may generate a separate reset signal instead of the next initialization signal GI(N+1) to independently control the reset operation of the pixel circuits 111A and 111B.

In addition, in the former turn-on voltage period in which the emission signal EM has the low-level voltage, when the compensation signal GC is in the turn-on voltage period (i.e., the three low-level voltages in FIG. 5), the fifth thin film transistor TT5 may be turned on so that the reference voltage VREF may be applied to the fourth pixel node N4, and the third thin film transistor TT3 is turned on so that the first thin film transistor TT1 may be diode-connected via the ninth thin film transistor TT9 (at this time, the ninth thin film transistor TT9 has been turned on in response to the connection signal GT). Here, the voltage of the fourth pixel node N4 may be the reference voltage VREF, and the voltage of the first pixel node N1 may be a value (i.e., ELVDD+Vth) obtained by adding a threshold voltage Vth of the first thin film transistor TT1 (at this time, since the first thin film transistor TT1 is a PMOS transistor, the threshold voltage Vth of the first thin film transistor TT1 has a negative value) to the first power supply voltage ELVDD.

Furthermore, in the former turn-on voltage period in which the emission signal EM has the low-level voltage, when the gate signal GW is in the turn-on voltage period (i.e., the low-level voltage in FIG. 5), the second thin film transistor TT2 may be turned on so that the data voltage VDATA may be applied to the fourth pixel node N4. Accordingly, due to the storage capacitor CST, the voltage of the first pixel node N1 may be a value (i.e., ELVDD+Vth+VDATA−VREF) obtained by adding a value, which is obtained by subtracting the reference voltage VREF from the data voltage VDATA (i.e., VDATA−VREF), to the previous value (i.e., ELVDD+Vth). Here, the driving current controlled by the first thin film transistor TT1 may be proportional to the equation (Vgs−Vth)^2 (at this time, Vgs is a voltage between a gate and a source of the first thin film transistor TT1). Since the threshold voltage Vth of the first thin film transistor TT1 is removed from the above mathematical formula (i.e., the above mathematical formula is changed to (VDATA−VREF)^2), the threshold voltage Vth of the first thin film transistor TT1 may be compensated. In other words, the driving current controlled by the first thin film transistor TT1 may be determined based on the reference voltage VREF and the data voltage VDATA regardless of the threshold voltage Vth of the first thin film transistor TT1.

Thereafter, the connection signal GT may be in a turn-off voltage period (i.e., a low-level voltage in FIG. 5) in the turn-off voltage period in which the emission signal EM has the high-level voltage. In other words, in the turn-off voltage period in which the emission signal EM has the high-level voltage, the eighth thin film transistor TT8 and the ninth thin film transistor TT9 may be turned off so that the fifth pixel node N5 and the fourth pixel node N4 may be electrically disconnected from each other, and the first pixel node N1 and the third pixel node N3 may also be electrically disconnected from each other.

In addition, each of the initialization signal GI, the compensation signal GC, and the gate signal GW may also be in a turn-off voltage period (i.e., a high-level voltage in FIG. 5) in the turn-off voltage period in which the emission signal EM has the high-level voltage. In other words, the second thin film transistor TT2, the third thin film transistor TT3, the fourth thin film transistor TT4, the fifth thin film transistor TT5, the sixth thin film transistor TT6, the eighth thin film transistor TT8, and the ninth thin film transistor TT9 may all be turned off as well.

In this state, since a predetermined period in which the output signal EB output from the scan driver 130 for applying the bias voltage has a low-level voltage exists (i.e., the output signal EB output from the scan driver 130 for applying the bias voltage is switched from a high-level voltage to the low-level voltage, and then switched again to the high-level voltage), the bias capacitor CBIAS may directly or indirectly boost the voltage of the gate terminal of the first thin film transistor TT1, which is the driving transistor, by using the bias voltage corresponding to the difference between the high-level voltage and the low-level voltage of the output signal EB output from the scan driver 130 for applying the bias voltage.

For example, since the bias capacitor CBIAS is connected to the fourth pixel node N4 in the pixel circuit 111A of FIG. 3, the voltage of the first pixel node N1, that is, the gate terminal of the first thin film transistor TT1, which is the driving transistor, may be boosted indirectly (i.e., via the storage capacitor CST) by the bias voltage corresponding to the difference between the high-level voltage and the low-level voltage of the output signal EB output from the scan driver 130 for applying the bias voltage. Meanwhile, since the bias capacitor CBIAS is directly connected to the first pixel node N1 in the pixel circuit 111B of FIG. 4, the voltage of the first pixel node N1, that is, the gate terminal of the first thin film transistor TT1, which is the driving transistor, may be boosted directly by the bias voltage corresponding to the difference between the high-level voltage and the low-level voltage of the output signal EB output from the scan driver 130 for applying the bias voltage.

Next, in a latter turn-on voltage period in which the emission signal EM has the low-level voltage, the connection signal GT may be in the turn-off voltage period (i.e., the low-level voltage in FIG. 5), and each of the initialization signal GI, the compensation signal GC, and the gate signal GW may also be in the turn-off voltage period (i.e., the high-level voltage in FIG. 5). Therefore, the first thin film transistor TT1 may be turned on by the voltage stored in the storage capacitor CST to allow the driving current to flow to the light emitting element EE, so that an emission operation of allowing the light emitting element EE to emit a light corresponding to the driving current may be performed.

Figure 6:
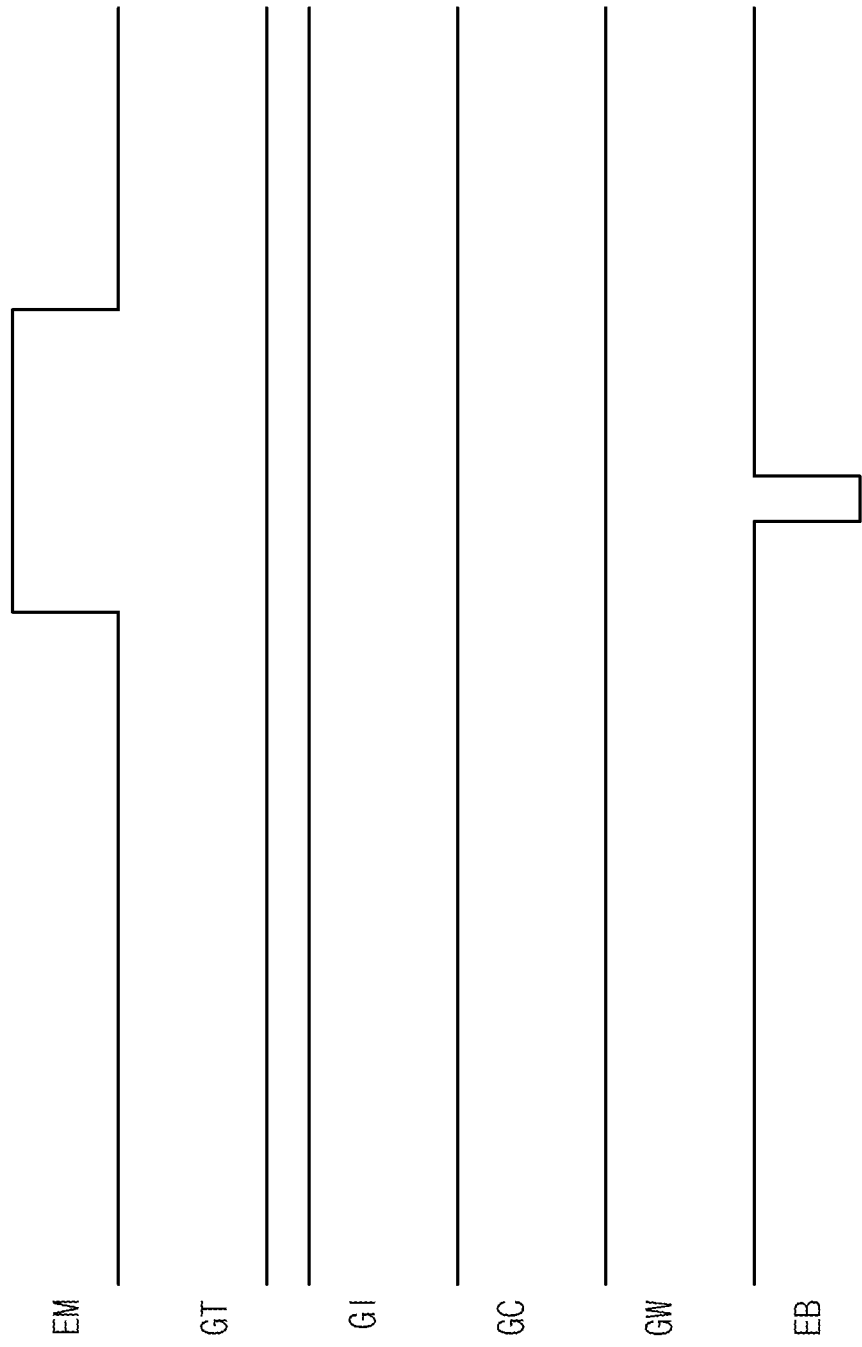
FIG. 6 is a timing diagram illustrating signals applied to the pixel circuit of FIG. 3 or the pixel circuit of FIG. 4 in a self scan period.

FIG. 6 is a timing diagram illustrating signals applied to the pixel circuit of FIG. 3 or the pixel circuit of FIG. 4 in a self scan period.

Referring to FIG. 6, the signals EM, GT, GI, GC, GW, and EB applied to the pixel circuits 111A and 111B when the pixel circuits 111A and 111B perform the self scan operation in the self scan period SELF SCAN have been shown in the drawing.

Each of the connection signal GT, the initialization signal GI, the compensation signal GC, and the gate signal GW may include only the turn-off voltage period in the self scan period SELF SCAN. In other words, in the self scan period SELF SCAN, each of the initialization signal GI, the compensation signal GC, and the gate signal GW may have the high-level voltage, and the connection signal GT may have the low-level voltage. Meanwhile, the emission signal EM may include both the turn-off voltage period (i.e., the high-level voltage) and the turn-on voltage period (i.e., the low-level voltage). Therefore, the pixel circuits 111A and 111B may perform the emission operation without performing the data writing operation in the self scan period SELF SCAN.

Meanwhile, when the emission signal EM is in the turn-off voltage period, since the predetermined period in which the output signal EB output from the scan driver 130 for applying the bias voltage has the low-level voltage exists (i.e., the output signal EB output from the scan driver 130 for applying the bias voltage is switched from the high-level voltage to the low-level voltage, and then switched again to the high-level voltage), the voltage of the gate terminal of the first thin film transistor TT1, which is the driving transistor, may be boosted directly or indirectly by the bias voltage corresponding to the difference between the high-level voltage and the low-level voltage of the output signal EB output from the scan driver 130 for applying the bias voltage. Accordingly, even when a frame rate of the panel driving frame for driving the display panel 110 varies, hysteresis characteristics in which characteristics of the first thin film transistor TT1, which is the driving transistor, are fixed into a predetermined state may be improved. As a result, according to the display device 100, a high-quality image may be displayed even when a variable frame rate technology is adopted.

As described above, the bias voltage for boosting the voltage of the gate terminal of the first thin film transistor TT1, which is the driving transistor, may be easily adjusted by varying the high-level voltage and/or the low-level voltage of the output signal EB output from the scan driver 130 for applying the bias voltage.

Figure 7:
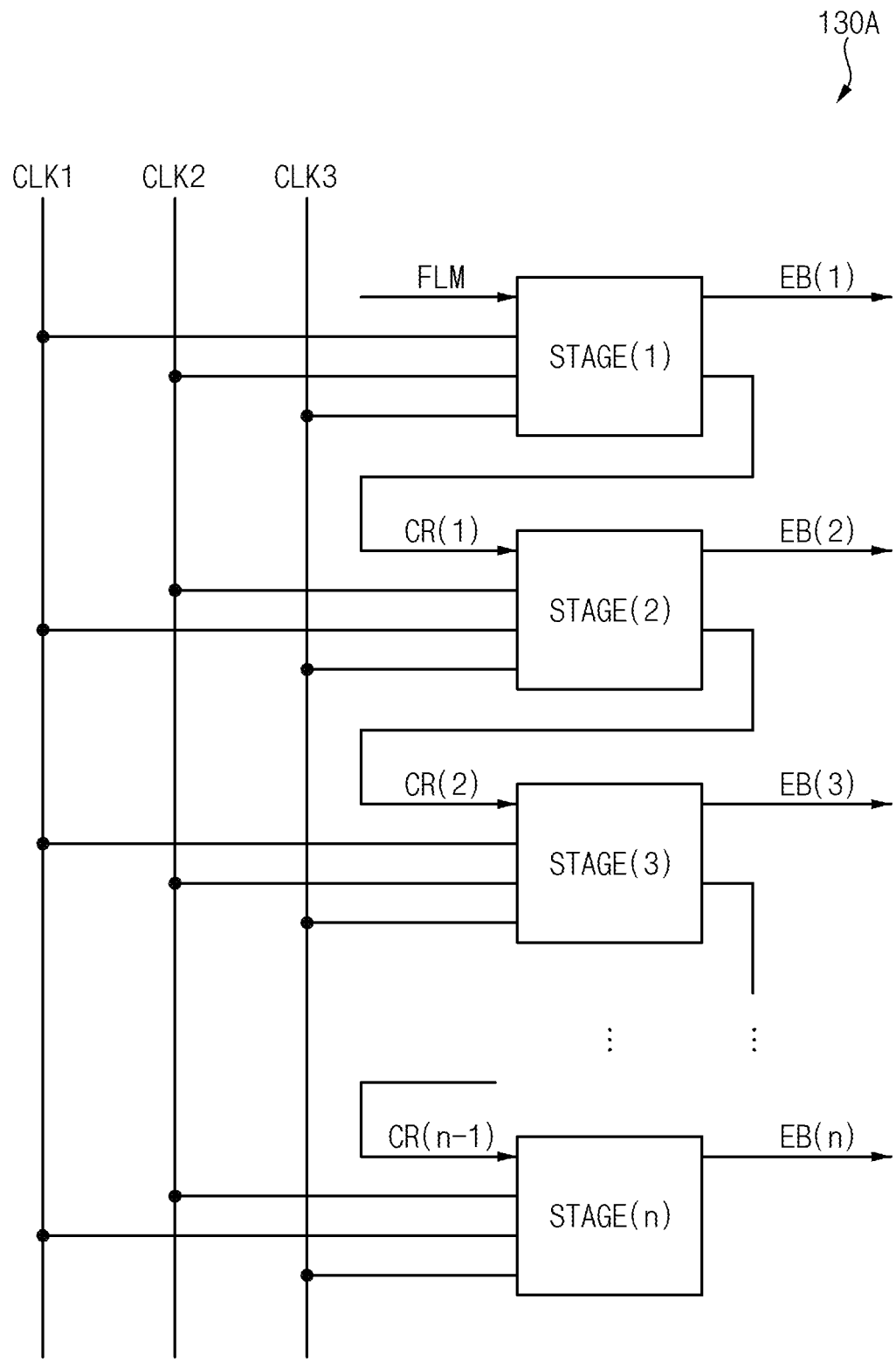
FIG. 7 is a block diagram illustrating an example of a scan driver for applying a bias voltage included in the display device of FIG. 1.
Figure 8:
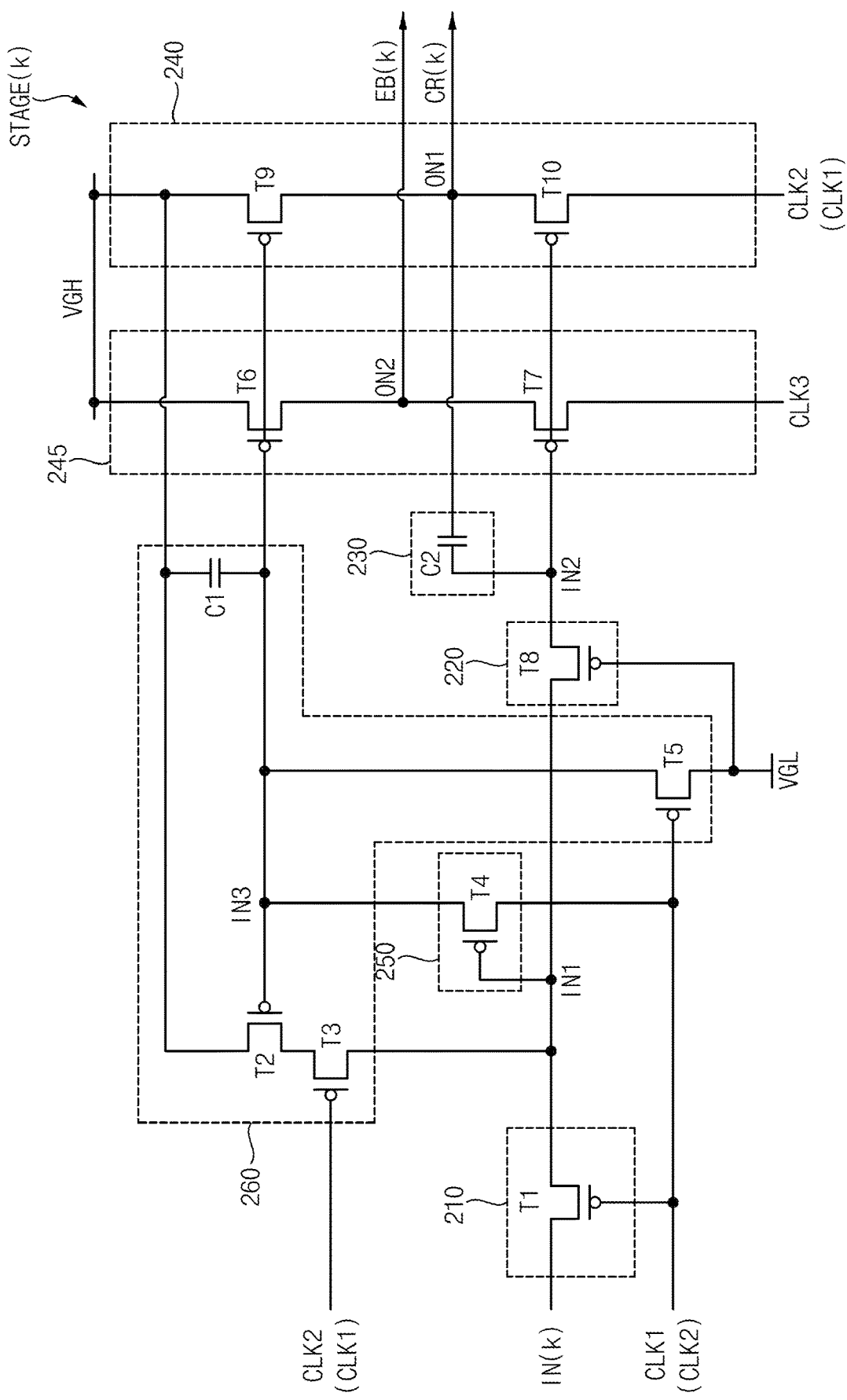
FIG. 8 is a circuit diagram illustrating a $k^{th}$ stage included in the scan driver for applying the bias voltage of FIG. 7.
Figure 9:
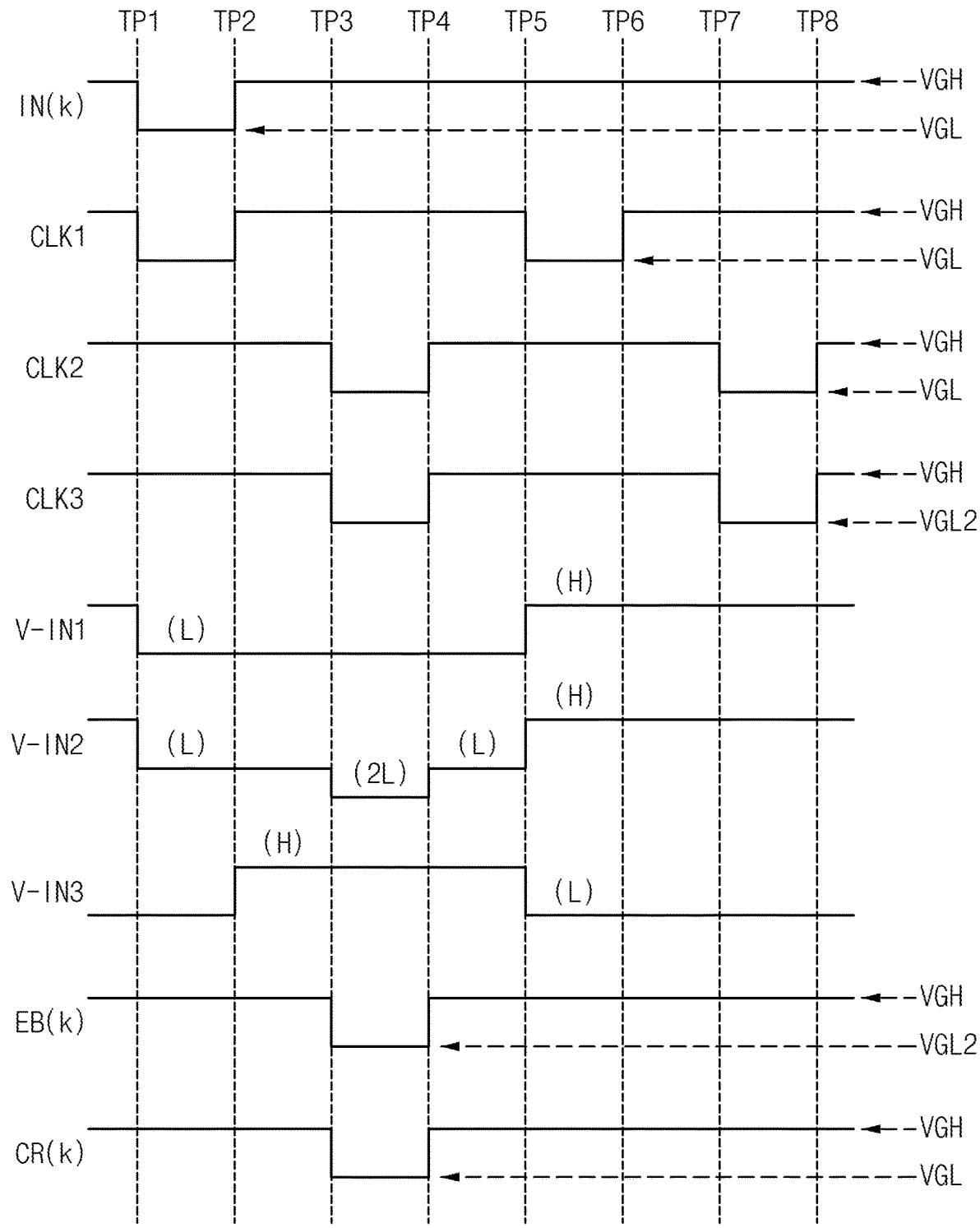
FIG. 9 is a timing diagram for describing an operation of the $k^{th}$ stage of FIG. 8.
Figure 10:
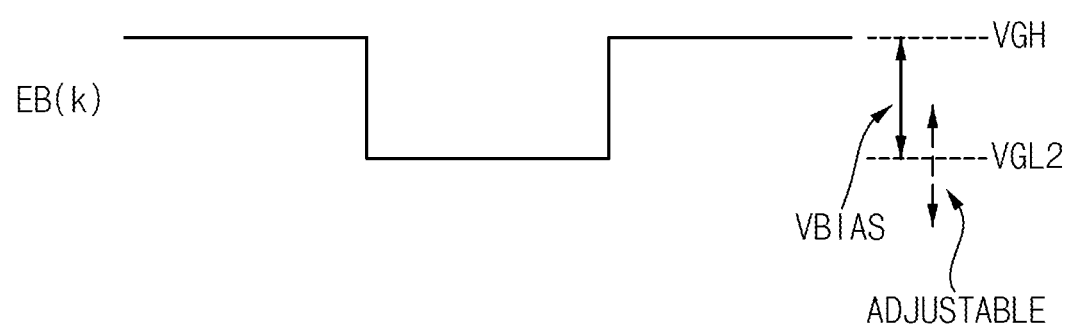
FIG. 10 is a diagram for explaining how the scan driver for applying the bias voltage of FIG. 7 adjusts the bias voltage.

FIG. 7 is a block diagram illustrating an example of a scan driver for applying a bias voltage included in the display device of FIG. 1, FIG. 8 is a circuit diagram illustrating a $k^{th}$ stage included in the scan driver for applying the bias voltage of FIG. 7, FIG. 9 is a timing diagram for describing an operation of the $k^{th}$ stage of FIG. 8, and FIG. 10 is a diagram for explaining how the scan driver for applying the bias voltage of FIG. 7 adjusts the bias voltage.

Referring to FIGS. 7 to 10, a scan driver 130A for applying a bias voltage may include first to $n^{th}$ stages STAGE(1) to STAGE(n) configured to output first to $n^{th}$ output signals EB(1) to EB(n) for applying the bias voltage to the first to $n^{th}$ pixel rows, respectively.

The scan driver 130A for applying the bias voltage may receive a first clock signal CLK1, a second clock signal CLK2, and a third clock signal CLK3. However, since waveforms of the first clock signal CLK1, second clock signal CLK2, and third clock signal CLK3 shown in FIG. 8 have been provided for illustrative purposes, the waveforms of the first clock signal CLK1, the second clock signal CLK2, and the third clock signal CLK3 applied to the scan driver 130A for applying the bias voltage are not limited thereto. Meanwhile, the first clock signal CLK1 may toggle between a high power supply voltage VGH and a first low power supply voltage VGL, the second clock signal CLK2 may toggle between the high power supply voltage VGH and the first low power supply voltage VGL, and the third clock signal CLK3 may toggle between the high power supply voltage VGH and a second low power supply voltage VGL2. Here, the second low power supply voltage VGL2 may vary to adjust the bias voltage VBIAS for boosting the voltage of the gate terminal (i.e., the first pixel node N1) of the first thin film transistor TT1, which is the driving transistor, in the pixel circuit 111.

Meanwhile, as shown in FIG. 7, each of the first to $n^{th}$ stages STAGE(1) to STAGE(n) may receive the first clock signal CLK1 and the second clock signal CLK2 oppositely to an adjacent stage. Therefore, when a first clock signal described in the claims is interpreted as the first clock signal CLK1, a second clock signal described in the claims may be interpreted as the second clock signal CLK2, and when the first clock signal described in the claims is interpreted as the second clock signal CLK2, the second clock signal described in the claims may be interpreted as the first clock signal CLK1. However, for convenience of description, in FIGS. 7 to 10, the first clock signal described in the claims will be described as the first clock signal CLK1, and the second clock signal described in the claims will be described as the second clock signal CLK2.

The $k^{th}$ stage STAGE(k) may receive the first clock signal CLK1, the second clock signal CLK2, the third clock signal CLK3, and an input signal IN(k), may provide the $k^{th}$ output signal EB(k) to the pixel circuits 111 included in the $k^{th}$ pixel row, and may output a $k^{th}$ carry signal CR(k) to a next stage, that is, the $(k+1)^{th}$ stage STAGE(k+1). Here, the first stage STAGE(1) may receive a scan start signal FLM as the input signal IN(k), and the $k^{th}$ stage STAGE(k) may receive a $(k-1)^{th}$ carry signal CR(k-1) output from a previous stage, that is, the $(k-1)^{th}$ stage STAGE(k-1) as the input signal IN(k).

As described above, the $k^{th}$ stage STAGE(k) may provide the $k^{th}$ output signal EB(k) to the pixel circuits 111 included in the $k^{th}$ pixel row. Accordingly, the voltage of the gate terminal (i.e., the first pixel node N1) of the first thin film transistor TT1, which is the driving transistor of each of the pixel circuits 111 included in the $k^{th}$ pixel row, may be boosted by a bias voltage VBIAS corresponding to a difference between a high-level voltage and a low-level voltage of the $k^{th}$ output signal EB(k). Here, the high-level voltage of the $k^{th}$ output signal EB(k) may be the high power supply voltage VGH of the third clock signal CLK3, and the low-level voltage of the $k^{th}$ output signal EB(k) may be the second low power supply voltage VGL2 of the third clock signal CLK3.

In detail, as shown in FIG. 8, the $k^{th}$ stage STAGE(k) may include an inputter 210, a stress reliever 220, a bootstrapper 230, a carry signal outputter 240, an output signal outputter 245, a maintainer 250, and a stabilizer 260.

The inputter 210 may transmit the input signal IN(k) to a first node IN1 in response to the first clock signal CLK1. In an embodiment, the inputter 210 may include a first transistor T1 including a first terminal configured to receive the input signal IN(k), a second terminal connected to the first node IN1, and a gate terminal configured to receive the first clock signal CLK1. Meanwhile, the input signal IN(k) may be the scan start signal FLM or a previous carry signal CR(k-1). In detail, when the $k^{th}$ stage STAGE(k) is the first stage STAGE(1), the input signal IN(k) may be the scan start signal FLM, and when the $k^{th}$ stage STAGE(k) is not the first stage STAGE(1), the input signal IN(k) may be the $(k-1)^{th}$ carry signal CR(k-1) output from the previous stage, that is, the $(k-1)^{th}$ stage STAGE(k-1).

The stress reliever 220 may be disposed between the first node IN1 and a second node IN2, and may transmit the input signal IN(k) received by the inputter 210 from the first node IN1 to the second node IN2. In an embodiment, the stress reliever 220 may include an eighth transistor T8 including a first terminal connected to the first node IN1, a second terminal connected to the second node IN2, and a gate terminal configured to receive the first low power supply voltage VGL. When the second node IN2 is bootstrapped so that a voltage V-IN2 of the second node IN2 may have a second low-level voltage 2L, the stress reliever 220 may not transmit the voltage V-IN2 of the second node IN2 having the second low-level voltage 2L to the first node IN1, so that voltage stress applied to transistors (i.e., T1, T3, and T4) connected to the first node IN1 may be reduced.

The bootstrapper 230 may be disposed between the second node IN2 and a first output node ON1. The bootstrapper 230 may bootstrap the second node IN2 to change the voltage V-IN2 of the second node IN2 from a first low-level voltage L to the second low-level voltage 2L that is lower than the first low-level voltage L. For example, as shown in FIG. 9, the first low-level voltage L may be the first low power supply voltage VGL, and the second low-level voltage 2L may be a voltage that is lower than the first low power supply voltage VGL (e.g., a value with a larger absolute value when the first low power supply voltage VGL has a negative value). Here, a difference between the first low-level voltage L and the second low-level voltage 2L may correspond to, but is not limited to, a difference between the high power supply voltage VGH and the first low power supply voltage VGL. In an embodiment, the bootstrapper 230 may include a second capacitor C2 including a first terminal connected to the second node IN2 and a second terminal connected to the first output node ON1.

The carry signal outputter 240 may receive the high power supply voltage VGH and the second clock signal CLK2 and may output the second clock signal CLK2 as the $k^{th}$ carry signal CR(k) through the first output node ON1 in response to the voltage V-IN2 of the second node IN2 (e.g., in response to the voltage V-IN2 of the second node IN2 having the second low-level voltage 2L as the second node IN2 is bootstrapped). In an embodiment, the carry signal outputter 240 may include a ninth transistor T9 including a first terminal configured to receive the high power supply voltage VGH, a second terminal connected to the first output node ON1, and a gate terminal connected to a third node IN3, and a tenth transistor T10 including a first terminal connected to the first output node ON1, a second terminal configured to receive the second clock signal CLK2, and a gate terminal connected to the second node IN2. As described above, since the second clock signal CLK2 toggles between the high power supply voltage VGH and the first low power supply voltage VGL, the $k^{th}$ carry signal CR(k) may have the high power supply voltage VGH or the first low power supply voltage VGL.

The output signal outputter 245 may receive the high power supply voltage VGH and the third clock signal CLK3 and may output the third clock signal CLK3 as the $k^{th}$ output signal EB(k) through a second output node ON2 in response to the voltage V-IN2 of the second node IN2 (e.g., in response to the voltage V-IN2 of the second node IN2 having the second low-level voltage 2L as the second node IN2 is bootstrapped). In an embodiment, the output signal outputter 245 may include a sixth transistor T6 including a first terminal configured to receive the high power supply voltage VGH, a second terminal connected to the second output node ON2, and a gate terminal connected to the third node IN3, and a seventh transistor T7 including a first terminal connected to the second output node ON2, a second terminal configured to receive the third clock signal CLK3, and a gate terminal connected to the second node IN2. As described above, since the third clock signal CLK3 toggles between the high power supply voltage VGH and the second low power supply voltage VGL2, the $k^{th}$ output signal EB(k) may have the high power supply voltage VGH or the second low power supply voltage VGL2.

Here, since the high power supply voltage VGH is commonly used in the carry signal outputter 240 and the output signal outputter 245, the high power supply voltage VGH may be fixed. Meanwhile, since the second low power supply voltage VGL2 is used only in the output signal outputter 245, when adjustment of the bias voltage VBIAS for directly or indirectly boosting the voltage of the gate terminal of the driving transistor in the pixel circuit 111 is required, the second low power supply voltage VGL2 may vary (i.e., denoted by ADJUSTABLE in FIG. 10). In addition, since the high-level voltage (i.e., the high power supply voltage VGH) of the third clock signal CLK3 applied to the output signal outputter 245 and the high power supply voltage VGH applied to the output signal outputter 245 are the same, distortion may not occur in the high-level voltage of the $k^{th}$ output signal EB(k). Meanwhile, as shown in FIG. 10, since the bias voltage VBIAS for directly or indirectly boosting the voltage of the gate terminal of the driving transistor in the pixel circuit 111 corresponds to the difference between the high-level voltage (i.e., the high power supply voltage VGH) and the low-level voltage (i.e., the second low power supply voltage VGL2) of the $k^{th}$ output signal EB(k), the scan driver 130A for applying the bias voltage may vary the low-level voltage (i.e., the second low power supply voltage VGL2) of the $k^{th}$ output signal EB(k) so as to easily adjust the bias voltage VBIAS for directly or indirectly boosting the voltage of the gate terminal of the driving transistor in the pixel circuit 111.

The maintainer 250 may transmit the first clock signal CLK1 to the third node IN3 in response to a voltage V-IN1 of the first node IN1. In an embodiment, the maintainer 250 may include a fourth transistor T4 including a first terminal connected to the third node IN3, a second terminal configured to receive the first clock signal CLK1, and a gate terminal connected to the first node IN1. As described above, since the second clock signal CLK2 toggles between the high power supply voltage VGH and the first low power supply voltage VGL, the maintainer 250 may maintain the third node IN3 at a high-level voltage H (e.g., the high power supply voltage VGH) while the $k^{th}$ output signal EB(k) and the $k^{th}$ carry signal CR(k) are output.

The stabilizer 260 may apply the first low power supply voltage VGL to the third node IN3 in response to the first clock signal CLK1 and may apply the high power supply voltage VGH to the first node IN1 in response to the second clock signal CLK2. In an embodiment, the stabilizer 260 may include a second transistor T2 including a first terminal configured to receive the high power supply voltage VGH, a second terminal connected to the first terminal of the third transistor T3, and a gate terminal connected to the third node IN3, a third transistor T3 including a first terminal connected to the second terminal of the second transistor T2, a second terminal connected to the first node IN1, and a gate terminal configured to receive the second clock signal CLK2, a first capacitor C1 including a first terminal configured to receive the high power supply voltage VGH and a second terminal connected to the third node IN3, and a fifth transistor T5 including a first terminal connected to the third node IN3, a second terminal configured to receive the first low power supply voltage VGL, and a gate terminal configured to receive the first clock signal CLK1.

Hereinafter, an operation of the $k^{th}$ stage STAGE(k) included in the scan driver 130A for applying the bias voltage will be described with reference to FIGS. 8 and 9. However, as shown in FIGS. 8 and 9, in the following description, it will be assumed that all of the transistors T1 to T10 are PMOS transistors, the first low-level voltage L corresponds to the first low power supply voltage VGL, the second low-level voltage 2L corresponds to a voltage that is lower than the first low power supply voltage VGL, and the high-level voltage H corresponds to the high power supply voltage VGH.

The k$^{th}$ stage STAGE(k) may receive the input signal IN(k), the first clock signal CLK1, the second clock signal CLK2, and the third clock signal CLK3.

In a period from a first time point TP1 to a second time point TP2, an input signal IN(k) having the first low power supply voltage VGL may be applied, and a first clock signal CLK1 having the first low power supply voltage VGL may be applied. The first transistor T1 may transmit the input signal IN(k) to the first node IN1 in response to the first clock signal CLK1 having the first low power supply voltage VGL, and the voltage V-IN1 of the first node IN1 may be changed from the high-level voltage H corresponding to the high power supply voltage VGH to the first low-level voltage L corresponding to the first low power supply voltage VGL. In addition, the eighth transistor T8 may transmit the input signal IN(k) from the first node IN1 to the second node IN2 in response to the first low power supply voltage VGL, so that the voltage V-IN2 of the second node IN2 may be changed from the high-level voltage H corresponding to the high power supply voltage VGH to the first low-level voltage L corresponding to the first low power supply voltage VGL.

The first clock signal CLK1 may be changed from the first low power supply voltage VGL to the high power supply voltage VGH at the second time point TP2, and a first clock signal CLK1 having the high power supply voltage VGH may be applied in a period from the second time point TP2 to a third time point TP3. The fourth transistor T4 transmit the first clock signal CLK1 having the high power supply voltage VGH to the third node IN3 in response to the voltage V-IN1 of the first node IN1 having the first low-level voltage L, so that a voltage V-IN3 of the third node IN3 may be changed from the first low-level voltage L corresponding to the first low power supply voltage VGL to the high-level voltage H corresponding to the high power supply voltage VGH.

The second clock signal CLK2 may be changed from the high power supply voltage VGH to the first low power supply voltage VGL at the third point in time TP3, and a second clock signal CLK2 having the first low power supply voltage VGL may be applied in a period from the third time point TP3 to a fourth time point TP4. The tenth transistor T10 may transmit the second clock signal CLK2 having the first low power supply voltage VGL to the first output node ON1 in response to the voltage V-IN2 of the second node IN2, so that the second clock signal CLK2 having the first low power supply voltage VGL may be output from the first output node ON1 as the k$^{th}$ carry signal CR(k).

Meanwhile, as a voltage of the first output node ON1, that is, a voltage of the second terminal of the second capacitor C2 is changed from the high power supply voltage VGH to the first low power supply voltage VGL, the voltage V-IN2 of the second node IN2, that is, a voltage of the first terminal of the second capacitor C2 may be changed from the first low-level voltage L corresponding to the first low power supply voltage VGL to the second low-level voltage 2L that is lower than the first low power supply voltage VGL. In an embodiment, the difference between the first low-level voltage L and the second low-level voltage 2L may correspond to, but is not limited to, the difference between the high power supply voltage VGH and the first low power supply voltage VGL. Meanwhile, an operation of changing the voltage V-IN2 of the second node IN2 from the first low-level voltage L to the second low-level voltage 2L may be referred to as a bootstrap operation, and the second capacitor C2 may be referred to as a bootstrap capacitor. In addition, the eighth transistor T8 may not transmit the voltage V-IN2 of the second node IN2 having the second low-level voltage 2L to the first node IN1, so that the voltage stress applied to the transistors (i.e., T1, T3, and T4) connected to the first node IN1 may be reduced. Accordingly, the eighth transistor T8 may be referred to as a stress relief transistor.

In addition, the third clock signal CLK3 may be changed from the high power supply voltage VGH to the second low power supply voltage VGL2 at the third time point TP3, and a third clock signal CLK3 having the second low power supply voltage VGL2 may be applied in the period from the third time point TP3 to the fourth time point TP4. The seventh transistor T7 may transmit the third clock signal CLK3 having the second low power supply voltage VGL2 to the second output node ON2 in response to the voltage V-IN2 of the second node IN2, so that the third clock signal CLK3 having the second low power supply voltage VGL2 may be output from the second output node ON2 as the k$^{th}$ output signal EB(k).

Meanwhile, while the k$^{th}$ output signal EB(k) and the k$^{th}$ carry signal CR(k) are output, the fourth transistor T4 including the gate terminal configured to receive the voltage V-IN1 of the first node IN1 having the first low-level voltage L may be turned on, so that the first clock signal CLK1 having the high power supply voltage VGH may be applied to the third node IN3. Accordingly, the voltage V-IN3 of the third node IN3 may be maintained at the high-level voltage H corresponding to the high power supply voltage VGH. In addition, while the k$^{th}$ output signal EB(k) and the k$^{th}$ carry signal CR(k) are output, since the voltage V-IN3 of the third node IN3 has the high-level voltage H, the sixth transistor T6 and the ninth transistor T9 including the gate terminals configured to receive the voltage V-IN3 of the third node IN3 may be turned off.

When the second clock signal CLK2 is changed from the first low power supply voltage VGL to the high power supply voltage VGH at the fourth time point TP4, the k$^{th}$ carry signal CR(k) output from the first output node ON1 may be changed from the first low power supply voltage VGL to the high power supply voltage VGH. Here, when the voltage of the first output node ON1, that is, the voltage of the second terminal of the second capacitor C2 is changed from the first low power supply voltage VGL to the high power supply voltage VGH, the voltage of the first terminal of the second capacitor C2, that is, the voltage V-IN2 of the second node IN2 may be changed from the second low-level voltage 2L corresponding to the voltage that is lower than the first low power supply voltage VGL to the first low-level voltage L corresponding to the first low power supply voltage VGL.

In addition, when the third clock signal CLK3 is changed from the second low power supply voltage VGL2 to the high power supply voltage VGH at the fourth time point TP4, the k$^{th}$ output signal EB(k) output from the second output node ON2 may also be changed from the second low power supply voltage VGL2 to the high power supply voltage VGH.

The first clock signal CLK1 may be changed from the high power supply voltage VGH to the first low power supply voltage VGL at a fifth time point TP5, and the first clock signal CLK1 having the first low power supply voltage VGL may be applied in a period from the fifth time point TP5 to a sixth time point TP6. Accordingly, the first transistor T1 may change the voltage V-IN1 of the first node IN1 from the first low-level voltage L to the high-level voltage H (i.e., because the input signal IN(k) has the high power supply voltage VGH) in response to the first clock signal CLK1 having the first low power supply voltage VGL, and the eighth transistor T8 may change the voltage V-IN2 of the second node IN2 from the first low-level voltage L to the high-level voltage H in response to the first low power supply voltage VGL. In addition, the fifth transistor T5 may change the voltage V-IN3 of the third node IN3 from the high-level voltage H to the first low-level voltage L corresponding to the first low power supply voltage VGL in response to the first clock signal CLK1 having the first low power supply voltage VGL. Meanwhile, the fifth transistor T5 may be turned on whenever the first clock signal CLK1 has the first low power supply voltage VGL so as to apply the first low power supply voltage VGL to the third node IN3. The ninth transistor T9 may apply the high power supply voltage VGH to the first output node ON1 in response to the voltage V-IN3 of the third node IN3 having the first low-level voltage L, and the sixth transistor T6 may apply the high power supply voltage VGH to the second output node ON2 in response to the voltage V-IN3 of the third node IN3 having the first low-level voltage L.

The first clock signal CLK1 may be changed from the first low power supply voltage VGL to the high power supply voltage VGH at the sixth time point TP6, and the first clock signal CLK1 having the high power supply voltage VGH may be applied in a period from the sixth time point TP6 to a seventh time point TP7.

The second clock signal CLK2 may be changed from the high power supply voltage VGH to the first low power supply voltage VGL at the seventh time point TP7, and the second clock signal CLK2 having the first low power supply voltage VGL may be applied in a period from the seventh time point TP7 to an eighth time point TP8. The second transistor T2 may be turned on in response to the voltage V-IN3 of the third node IN3 having the first low-level voltage L, and the third transistor T3 may be turned on in response to the second clock signal CLK2 having the first low-level voltage L, so that the high power supply voltage VGH may be applied to the first node IN1 by the second and third transistors T2 and T3 so as to stabilize the voltage V-IN1 of the first node IN1 to the high-level voltage H corresponding to the high power supply voltage VGH. In addition, the eighth transistor T8 may be turned on in response to the first low power supply voltage VGL, so that the voltage V-IN2 of the second node IN2 may also be stabilized to the high-level voltage H corresponding to the high power supply voltage VGH. Meanwhile, the third transistor T3 may be turned on whenever the second clock signal CLK2 has the first low power supply voltage VGL so as to apply the high power supply voltage VGH to the first node IN1 and the second node IN2.

As described above, the $k^{th}$ stage STAGE(k) may include an inputter 210 configured to transmit the input signal IN(k) to the first node IN1 in response to the first clock signal CLK1, a stress reliever 220 disposed between the first node IN1 and the second node IN2, a carry signal outputter 240 configured to receive the high power supply voltage VGH and the second clock signal CLK2 and to output the second clock signal CLK2 as the $k^{th}$ carry signal CR(k) through the first output node ON1 in response to the voltage V-IN2 of the second node IN2, an output signal outputter 245 configured to receive the high power supply voltage VGH and the third clock signal CLK3 and to output the third clock signal CLK3 as the $k^{th}$ output signal EB(k) through the second output node ON2 in response to the voltage V-IN2 of the second node IN2, a maintainer 250 configured to transmit the first clock signal CLK1 to the third node IN3 in response to the voltage V-IN1 of the first node IN1, and a stabilizer 260 configured to apply the first low power supply voltage VGL to the third node IN3 in response to the first clock signal CLK1 and to apply the high power supply voltage VGH to the first node IN1 in response to the second clock signal CLK2.

Here, since each of the first clock signal CLK1 and the second clock signal CLK2 toggles between the high power supply voltage VGH and the first low power supply voltage VGL, and the third clock signal CLK3 toggles between the high power supply voltage VGH and the second low power supply voltage VGL2 that is variable, the scan driver 130A for applying the bias voltage may easily adjust the bias voltage VBIAS for directly or indirectly boosting the voltage of the gate terminal of the driving transistor in the pixel circuit 111 by varying the second low power supply voltage VGL2 of the third clock signal CLK3. As a result, according to the display device 100 including the scan driver 130A for applying the bias voltage, even when the frame rate of the panel driving frame for driving the display panel 110 varies (i.e., the driving frequency of the display panel 110 varies), the hysteresis characteristics in which the characteristics of the driving transistor are fixed into a predetermined state may be improved.

Figure 11:
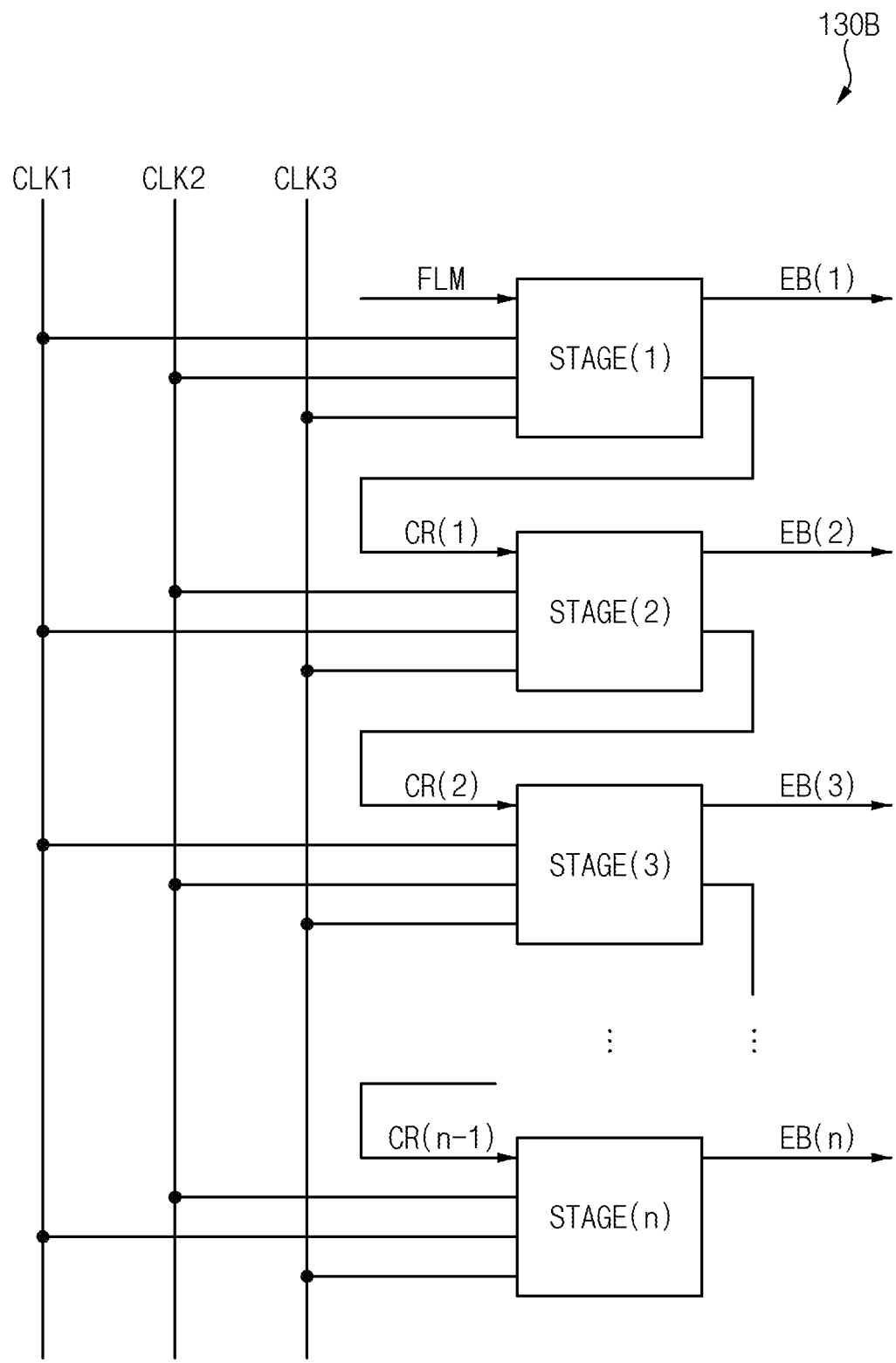
FIG. 11 is a block diagram illustrating another example of a scan driver for applying a bias voltage included in the display device of FIG. 1.
Figure 12:
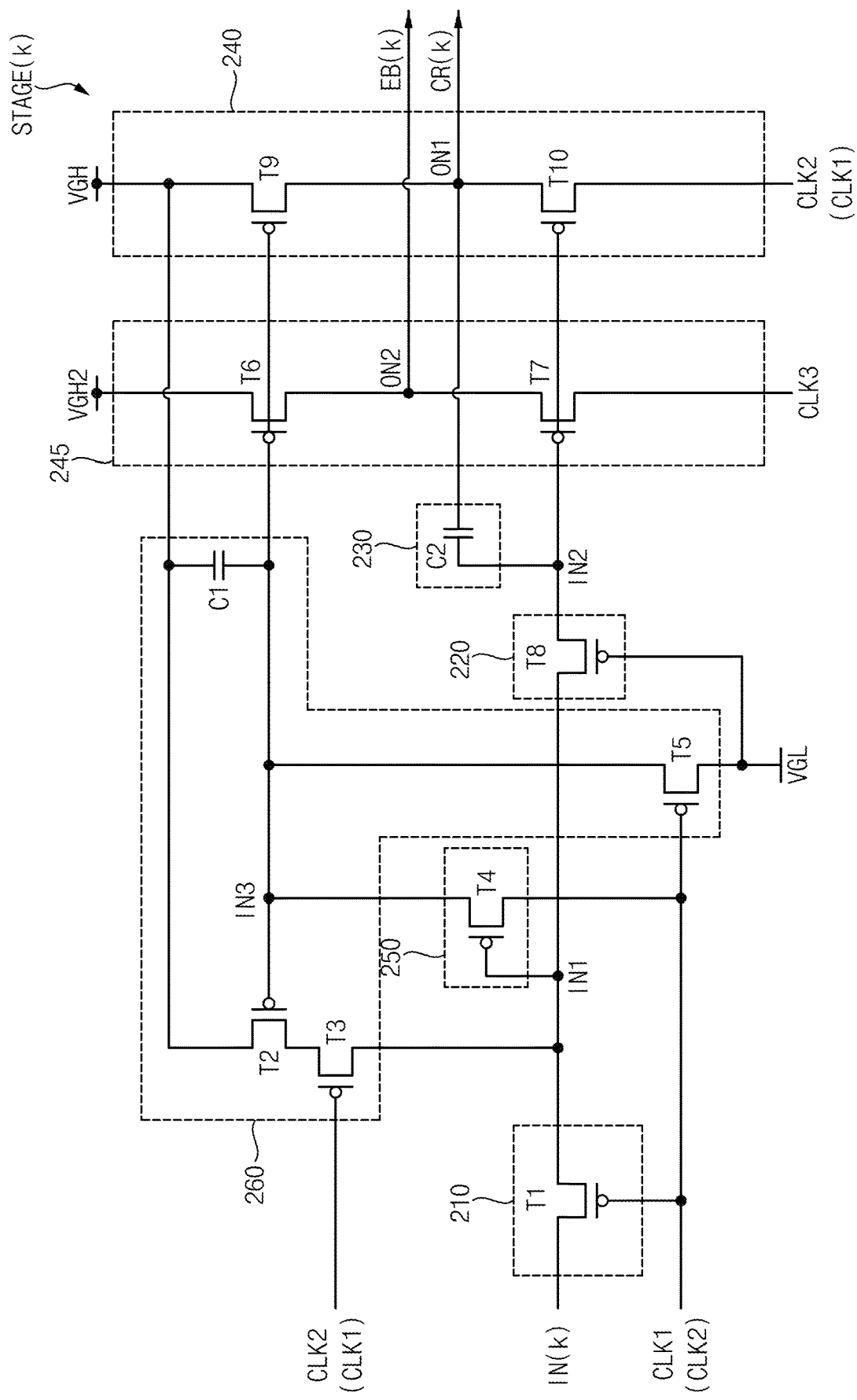
FIG. 12 is a circuit diagram illustrating a $k^{th}$ stage included in the scan driver for applying the bias voltage of FIG. 11.
Figure 13:
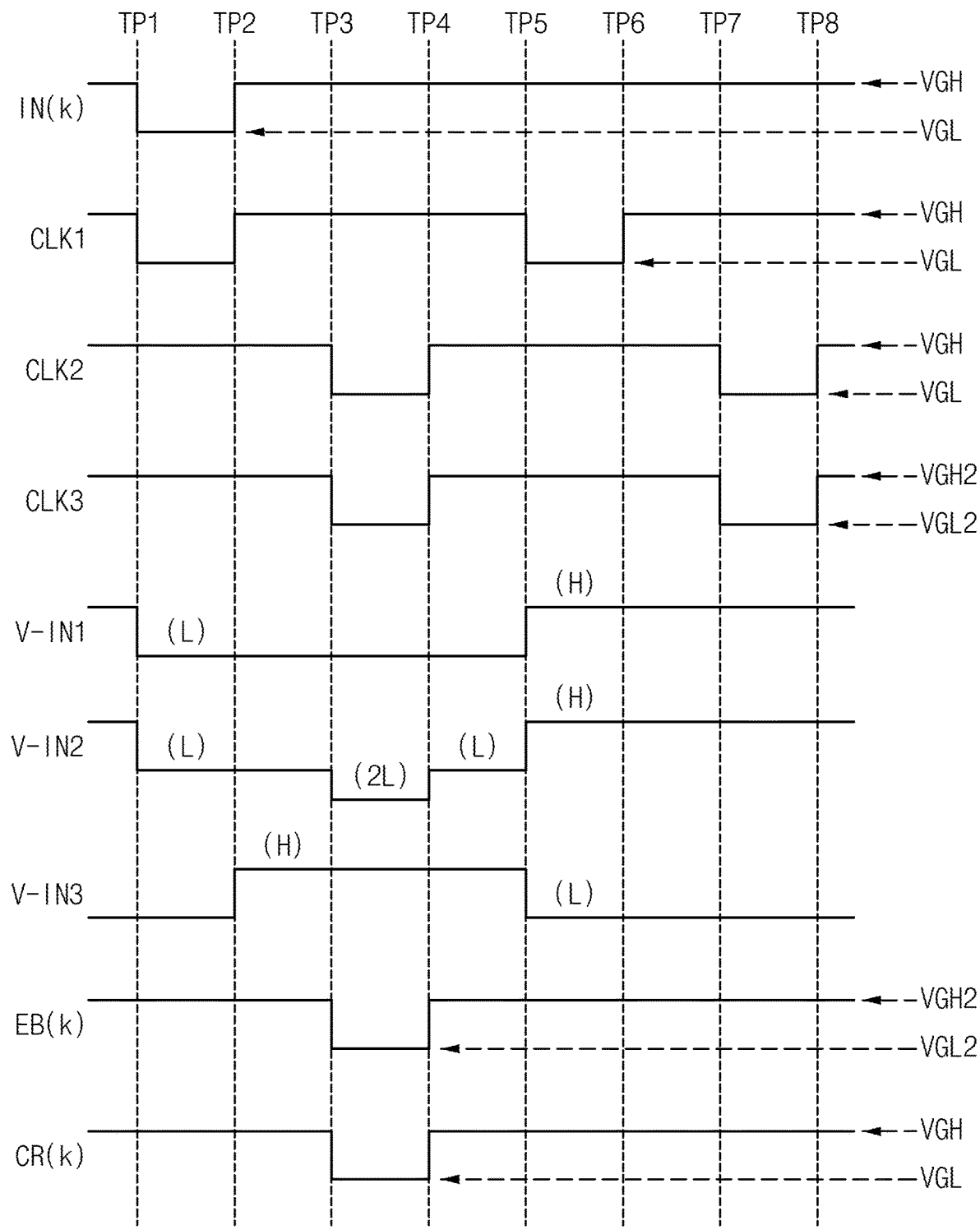
FIG. 13 is a timing diagram for describing an operation of the $k^{th}$ stage of FIG. 12.
Figure 14:
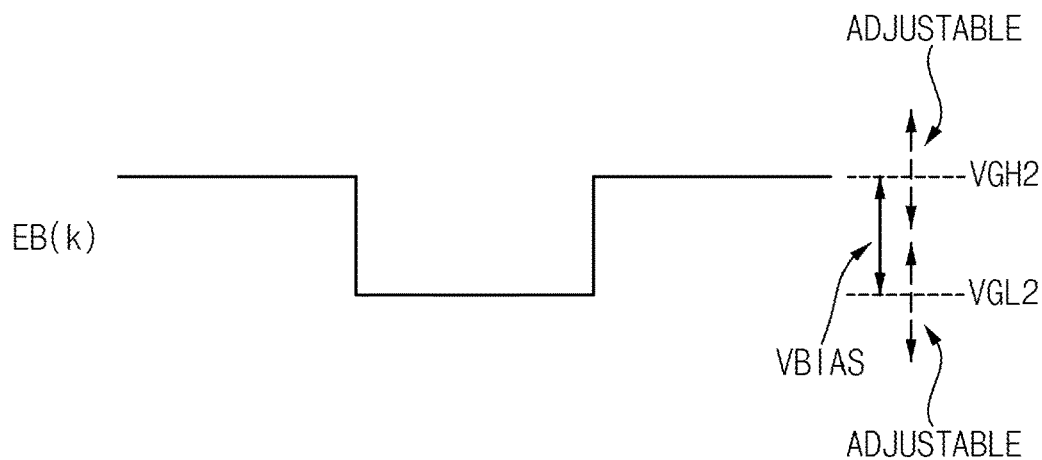
FIG. 14 is a diagram for explaining how the scan driver for applying the bias voltage of FIG. 11 adjusts the bias voltage.

FIG. 11 is a block diagram illustrating another example of a scan driver for applying a bias voltage included in the display device of FIG. 1, FIG. 12 is a circuit diagram illustrating a $k^{th}$ stage included in the scan driver for applying the bias voltage of FIG. 11, FIG. 13 is a timing diagram for describing an operation of the $k^{th}$ stage of FIG. 12, and FIG. 14 is a diagram for explaining how the scan driver for applying the bias voltage of FIG. 11 adjusts the bias voltage.

Referring to FIGS. 11 to 14, a scan driver 130B for applying a bias voltage may include first to $n^{th}$ stages STAGE(1) to STAGE(n) configured to output first to $n^{th}$ output signals EB(1) to EB(n) for applying the bias voltage to the first to $n^{th}$ pixel rows, respectively.

The scan driver 130B for applying the bias voltage may receive a first clock signal CLK1, a second clock signal CLK2, and a third clock signal CLK3. However, since waveforms of the first clock signal CLK1, second clock signal CLK2, and third clock signal CLK3 shown in FIG. 13 have been provided for illustrative purposes, the waveforms of the first clock signal CLK1, the second clock signal CLK2, and the third clock signal CLK3 applied to the scan driver 130B for applying the bias voltage are not limited thereto. Meanwhile, the first clock signal CLK1 may toggle between a first high power supply voltage VGH and a first low power supply voltage VGL, the second clock signal CLK2 may toggle between the first high power supply voltage VGH and the first low power supply voltage VGL, and the third clock signal CLK3 may toggle between a second high power supply voltage VGH2 and a second low power supply voltage VGL2. Here, the second high power supply voltage VGH2 and the second low power supply voltage VGL2 may vary to adjust the bias voltage VBIAS for boosting the voltage of the gate terminal (i.e., the first pixel node N1) of the first thin film transistor TT1, which is the driving transistor, in the pixel circuit 111.

Meanwhile, as shown in FIG. 11, each of the first to $n^{th}$ stages STAGE(1) to STAGE(n) may receive the first clock signal CLK1 and the second clock signal CLK2 oppositely to an adjacent stage. Therefore, when a first clock signal described in the claims is interpreted as the first clock signal CLK1, a second clock signal described in the claims may be interpreted as the second clock signal CLK2, and when the first clock signal described in the claims is interpreted as the second clock signal CLK2, the second clock signal described in the claims may be interpreted as the first clock signal CLK1. However, for convenience of description, in FIGS. 11 to 14, the first clock signal described in the claims will be described as the first clock signal CLK1, and the second clock signal described in the claims will be described as the second clock signal CLK2.

The $k^{th}$ stage STAGE(k) may receive the first clock signal CLK1, the second clock signal CLK2, the third clock signal CLK3, and an input signal IN(k), may provide the $k^{th}$ output signal EB(k) to the pixel circuits 111 included in the $k^{th}$ pixel row, and may output a $k^{th}$ carry signal CR(k) to a next stage, that is, the $(k+1)^{th}$ stage STAGE(k+1). Here, the first stage STAGE(1) may receive a scan start signal FLM as the input signal IN(k), and the $k^{th}$ stage STAGE(k) may receive a $(k-1)^{th}$ carry signal CR(k-1) output from a previous stage, that is, the $(k-1)^{th}$ stage STAGE(k-1) as the input signal IN(k).

As described above, the $k^{th}$ stage STAGE(k) may provide the $k^{th}$ output signal EB(k) to the pixel circuits 111 included in the $k^{th}$ pixel row. Accordingly, the voltage of the gate terminal (i.e., the first pixel node N1) of the first thin film transistor TT1 (i.e., the driving transistor) of each of the pixel circuits 111 included in the $k^{th}$ pixel row, may be boosted by a bias voltage VBIAS corresponding to a difference between a high-level voltage and a low-level voltage of the $k^{th}$ output signal EB(k). Here, the high-level voltage of the $k^{th}$ output signal EB(k) may be the second high power supply voltage VGH2 of the third clock signal CLK3, and the low-level voltage of the $k^{th}$ output signal EB(k) may be the second low power supply voltage VGL2 of the third clock signal CLK3.

In detail, as shown in FIG. 12, the $k^{th}$ stage STAGE(k) may include an inputter 210, a stress reliever 220, a bootstrapper 230, a carry signal outputter 240, an output signal outputter 245, a maintainer 250, and a stabilizer 260.

The inputter 210 may transmit the input signal IN(k) to a first node IN1 in response to the first clock signal CLK1. In an embodiment, the inputter 210 may include a first transistor T1 including a first terminal configured to receive the input signal IN(k), a second terminal connected to the first node IN1, and a gate terminal configured to receive the first clock signal CLK1. Meanwhile, the input signal IN(k) may be the scan start signal FLM or a previous carry signal CR(k-1). In detail, when the $k^{th}$ stage STAGE(k) is the first stage STAGE(1), the input signal IN(k) may be the scan start signal FLM, and when the $k^{th}$ stage STAGE(k) is not the first stage STAGE(1), the input signal IN(k) may be the $(k-1)^{th}$ carry signal CR(k-1) output from the previous stage, that is, the $(k-1)^{th}$ stage STAGE(k-1).

The stress reliever 220 may be disposed between the first node IN1 and a second node IN2, and may transmit the input signal IN(k) received by the inputter 210 from the first node IN1 to the second node IN2. In an embodiment, the stress reliever 220 may include an eighth transistor T8 including a first terminal connected to the first node IN1, a second terminal connected to the second node IN2, and a gate terminal configured to receive the first low power supply voltage VGL. When the second node IN2 is bootstrapped so that a voltage V-IN2 of the second node IN2 may have a second low-level voltage 2L, the stress reliever 220 may not transmit the voltage V-IN2 of the second node IN2 having the second low-level voltage 2L to the first node IN1, so that voltage stress applied to transistors (i.e., T1, T3, and T4) connected to the first node IN1 may be reduced.

The bootstrapper 230 may be disposed between the second node IN2 and a first output node ON1. The bootstrapper 230 may bootstrap the second node IN2 to change the voltage V-IN2 of the second node IN2 from a first low-level voltage L to the second low-level voltage 2L that is lower than the first low-level voltage L. For example, as shown in FIG. 13, the first low-level voltage L may be the first low power supply voltage VGL, and the second low-level voltage 2L may be a voltage that is lower than the first low power supply voltage VGL (e.g., a value with a larger absolute value when the first low power supply voltage VGL has a negative value). Here, a difference between the first low-level voltage L and the second low-level voltage 2L may correspond to, but is not limited to, a difference between the first high power supply voltage VGH and the first low power supply voltage VGL. In an embodiment, the bootstrapper 230 may include a second capacitor C2 including a first terminal connected to the second node IN2 and a second terminal connected to the first output node ON1.

The carry signal outputter 240 may receive the first high power supply voltage VGH and the second clock signal CLK2, and may output the second clock signal CLK2 as the $k^{th}$ carry signal CR(k) through the first output node ON1 in response to the voltage V-IN2 of the second node IN2 (e.g., in response to the voltage V-IN2 of the second node IN2 bootstrapped to have the second low-level voltage 2L). In an embodiment, the carry signal outputter 240 may include a ninth transistor T9 including a first terminal configured to receive the first high power supply voltage VGH, a second terminal connected to the first output node ON1, and a gate terminal connected to a third node IN3, and a tenth transistor T10 including a first terminal connected to the first output node ON1, a second terminal configured to receive the second clock signal CLK2, and a gate terminal connected to the second node IN2. As described above, since the second clock signal CLK2 toggles between the first high power supply voltage VGH and the first low power supply voltage VGL, the $k^{th}$ carry signal CR(k) may have the first high power supply voltage VGH or the first low power supply voltage VGL.

The output signal outputter 245 may receive the second high power supply voltage VGH2 and the third clock signal CLK3, and may output the third clock signal CLK3 as the $k^{th}$ output signal EB(k) through a second output node ON2 in response to the voltage V-IN2 of the second node IN2 (e.g., in response to the voltage V-IN2 of the second node IN2 bootstrapped to have the second low-level voltage 2L). In an embodiment, the output signal outputter 245 may include a sixth transistor T6 including a first terminal configured to receive the second high power supply voltage VGH2, a second terminal connected to the second output node ON2, and a gate terminal connected to the third node IN3, and a seventh transistor T7 including a first terminal connected to the second output node ON2, a second terminal configured to receive the third clock signal CLK3, and a gate terminal connected to the second node IN2. As described above, since the third clock signal CLK3 toggles between the second high power supply voltage VGH2 and the second low power supply voltage VGL2, the $k^{th}$ output signal EB(k) may have the second high power supply voltage VGH2 or the second low power supply voltage VGL2.

Here, since the first high power supply voltage VGH and the first low power supply voltage VGL are used in the carry signal outputter 240, the high power supply voltage VGH may be fixed. Meanwhile, since the second high power supply voltage VGH2 and the second low power supply voltage VGL2 are used in the output signal outputter 245, when adjustment of the bias voltage VBIAS for directly or indirectly boosting the voltage of the gate terminal of the driving transistor in the pixel circuit 111 is required, the second low power supply voltage VGL2 may vary (i.e., denoted by ADJUSTABLE in FIG. 14). In addition, since the high-level voltage (i.e., the second high power supply voltage VGH2) of the third clock signal CLK3 applied to the output signal outputter 245 and the second high power supply voltage VGH2 applied to the output signal outputter 245 are the same, distortion may not occur in the high-level voltage of the $k^{th}$ output signal EB(k). Meanwhile, as shown in FIG. 14, since the bias voltage VBIAS for directly or indirectly boosting the voltage of the gate terminal of the driving transistor in the pixel circuit 111 corresponds to the difference between the high-level voltage (i.e., the second high power supply voltage VGH2) and the low-level voltage (i.e., the second low power supply voltage VGL2) of the $k^{th}$ output signal EB(k), the scan driver 130B for applying the bias voltage may vary the high-level voltage (i.e., the second high power supply voltage VGH2) of the $k^{th}$ output signal EB(k) and/or the low-level voltage (i.e., the second low power supply voltage VGL2) of the $k^{th}$ output signal EB(k) so as to easily adjust the bias voltage VBIAS for directly or indirectly boosting the voltage of the gate terminal of the driving transistor in the pixel circuit 111.

The maintainer 250 may transmit the first clock signal CLK1 to the third node IN3 in response to a voltage V-IN1 of the first node IN1. In an embodiment, the maintainer 250 may include a fourth transistor T4 including a first terminal connected to the third node IN3, a second terminal configured to receive the first clock signal CLK1, and a gate terminal connected to the first node IN1. As described above, since the second clock signal CLK2 toggles between the first high power supply voltage VGH and the first low power supply voltage VGL, the maintainer 250 may maintain the third node IN3 at a high-level voltage H (e.g., the first high power supply voltage VGH) while the $k^{th}$ output signal EB(k) and the $k^{th}$ carry signal CR(k) are output.

The stabilizer 260 may apply the first low power supply voltage VGL to the third node IN3 in response to the first clock signal CLK1, and may apply the first high power supply voltage VGH to the first node IN1 in response to the second clock signal CLK2. In an embodiment, the stabilizer 260 may include a second transistor T2 including a first terminal configured to receive the first high power supply voltage VGH, a second terminal connected to the first terminal of the third transistor T3, and a gate terminal connected to the third node IN3, a third transistor T3 including a first terminal connected to the second terminal of the second transistor T2, a second terminal connected to the first node IN1, and a gate terminal configured to receive the second clock signal CLK2, a first capacitor C1 including a first terminal configured to receive the first high power supply voltage VGH and a second terminal connected to the third node IN3, and a fifth transistor T5 including a first terminal connected to the third node IN3, a second terminal configured to receive the first low power supply voltage VGL, and a gate terminal configured to receive the first clock signal CLKL.

Hereinafter, an operation of the $k^{th}$ stage STAGE(k) included in the scan driver 130B for applying the bias voltage will be described with reference to FIGS. 12 and 13. However, as shown in FIGS. 12 and 13, in the following description, it will be assumed that all of the transistors T1 to T10 are PMOS transistors, the first low-level voltage L corresponds to the first low power supply voltage VGL, the second low-level voltage 2L corresponds to a voltage that is lower than the first low power supply voltage VGL, and the high-level voltage H corresponds to the first high power supply voltage VGH.

The $k^{th}$ stage STAGE(k) may receive the input signal IN(k), the first clock signal CLK1, the second clock signal CLK2, and the third clock signal CLK3.

In a period from a first time point TP1 to a second time point TP2, an input signal IN(k) having the first low power supply voltage VGL may be applied, and a first clock signal CLK1 having the first low power supply voltage VGL may be applied. The first transistor T1 may transmit the input signal IN(k) to the first node IN1 in response to the first clock signal CLK1 having the first low power supply voltage VGL, and the voltage V-IN1 of the first node IN1 may be changed from the high-level voltage H corresponding to the first high power supply voltage VGH to the first low-level voltage L corresponding to the first low power supply voltage VGL. In addition, the eighth transistor T8 may transmit the input signal IN(k) from the first node IN1 to the second node IN2 in response to the first low power supply voltage VGL, so that the voltage V-IN2 of the second node IN2 may be changed from the high-level voltage H corresponding to the first high power supply voltage VGH to the first low-level voltage L corresponding to the first low power supply voltage VGL.

The first clock signal CLK1 may be changed from the first low power supply voltage VGL to the first high power supply voltage VGH at the second time point TP2, and a first clock signal CLK1 having the first high power supply voltage VGH may be applied in a period from the second time point TP2 to a third time point TP3. The fourth transistor T4 transmit the first clock signal CLK1 having the first high power supply voltage VGH to the third node IN3 in response to the voltage V-IN1 of the first node IN1 having the first low-level voltage L, so that a voltage V-IN3 of the third node IN3 may be changed from the first low-level voltage L corresponding to the first low power supply voltage VGL to the high-level voltage H corresponding to the first high power supply voltage VGH.

The second clock signal CLK2 may be changed from the first high power supply voltage VGH to the first low power supply voltage VGL at the third point in time TP3, and a second clock signal CLK2 having the first low power supply voltage VGL may be applied in a period from the third time point TP3 to a fourth time point TP4. The tenth transistor T10 may transmit the second clock signal CLK2 having the first low power supply voltage VGL to the first output node ON1 in response to the voltage V-IN2 of the second node IN2, so that the second clock signal CLK2 having the first low power supply voltage VGL may be output from the first output node ON1 as the $k^{th}$ carry signal CR(k).

Meanwhile, as a voltage of the first output node ON1, that is, a voltage of the second terminal of the second capacitor C2 is changed from the first high power supply voltage VGH to the first low power supply voltage VGL, the voltage V-IN2 of the second node IN2, that is, a voltage of the first terminal of the second capacitor C2 may be changed from the first low-level voltage L corresponding to the first low power supply voltage VGL to the second low-level voltage 2L that is lower than the first low power supply voltage VGL. In an embodiment, the difference between the first low-level voltage L and the second low-level voltage 2L may correspond to, but is not limited to, the difference between the first high power supply voltage VGH and the first low power supply voltage VGL. Meanwhile, an operation of changing the voltage V-IN2 of the second node IN2 from the first low-level voltage L to the second low-level voltage 2L may be referred to as a bootstrap operation, and the second capacitor C2 may be referred to as a bootstrap capacitor. In addition, the eighth transistor T8 may not transmit the voltage V-IN2 of the second node IN2 having the second low-level voltage 2L to the first node IN1, so that the voltage stress applied to the transistors (i.e., T1, T3, and T4) connected to the first node IN1 may be reduced. Accordingly, the eighth transistor T8 may be referred to as a stress relief transistor.

In addition, the third clock signal CLK3 may be changed from the second high power supply voltage VGH2 to the second low power supply voltage VGL2 at the third time point TP3, and a third clock signal CLK3 having the second low power supply voltage VGL2 may be applied in the period from the third time point TP3 to the fourth time point TP4. The seventh transistor T7 may transmit the third clock signal CLK3 having the second low power supply voltage VGL2 to the second output node ON2 in response to the voltage V-IN2 of the second node IN2, so that the third clock signal CLK3 having the second low power supply voltage VGL2 may be output from the second output node ON2 as the $k^{th}$ output signal EB(k).

Meanwhile, while the $k^{th}$ output signal EB(k) and the $k^{th}$ carry signal CR(k) are output, the fourth transistor T4 including the gate terminal configured to receive the voltage V-IN1 of the first node IN1 having the first low-level voltage L may be turned on, so that the first clock signal CLK1 having the first high power supply voltage VGH may be applied to the third node IN3. Accordingly, the voltage V-IN3 of the third node IN3 may be maintained at the high-level voltage H corresponding to the first high power supply voltage VGH. In addition, while the $k^{th}$ output signal EB(k) and the $k^{th}$ carry signal CR(k) are output, since the voltage V-IN3 of the third node IN3 has the high-level voltage H, the sixth transistor T6 and the ninth transistor T9 including the gate terminals configured to receive the voltage V-IN3 of the third node IN3 may be turned off.

When the second clock signal CLK2 is changed from the first low power supply voltage VGL to the first high power supply voltage VGH at the fourth time point TP4, the $k^{th}$ carry signal CR(k) output from the first output node ON1 may be changed from the first low power supply voltage VGL to the first high power supply voltage VGH. Here, when the voltage of the first output node ON1, that is, the voltage of the second terminal of the second capacitor C2 is changed from the first low power supply voltage VGL to the first high power supply voltage VGH, the voltage of the first terminal of the second capacitor C2, that is, the voltage V-IN2 of the second node IN2 may be changed from the second low-level voltage 2L corresponding to the voltage that is lower than the first low power supply voltage VGL to the first low-level voltage L corresponding to the first low power supply voltage VGL.

In addition, when the third clock signal CLK3 is changed from the second low power supply voltage VGL2 to the second high power supply voltage VGH2 at the fourth time point TP4, the $k^{th}$ output signal EB(k) output from the second output node ON2 may also be changed from the second low power supply voltage VGL2 to the second high power supply voltage VGH2.

The first clock signal CLK1 may be changed from the first high power supply voltage VGH to the first low power supply voltage VGL at a fifth time point TP5, and the first clock signal CLK1 having the first low power supply voltage VGL may be applied in a period from the fifth time point TP5 to a sixth time point TP6. Accordingly, the first transistor T1 may change the voltage V-IN1 of the first node IN1 from the first low-level voltage L to the high-level voltage H (i.e., because the input signal IN(k) has the first high power supply voltage VGH) in response to the first clock signal CLK1 having the first low power supply voltage VGL, and the eighth transistor T8 may change the voltage V-IN2 of the second node IN2 from the first low-level voltage L to the high-level voltage H in response to the first low power supply voltage VGL. In addition, the fifth transistor T5 may change the voltage V-IN3 of the third node IN3 from the high-level voltage H to the first low-level voltage L corresponding to the first low power supply voltage VGL in response to the first clock signal CLK1 having the first low power supply voltage VGL. Meanwhile, the fifth transistor T5 may be turned on whenever the first clock signal CLK1 has the first low power supply voltage VGL so as to apply the first low power supply voltage VGL to the third node IN3. The ninth transistor T9 may apply the first high power supply voltage VGH to the first output node ON1 in response to the voltage V-IN3 of the third node IN3 having the first low-level voltage L, and the sixth transistor T6 may apply the second high power supply voltage VGH2 to the second output node ON2 in response to the voltage V-IN3 of the third node IN3 having the first low-level voltage L.

The first clock signal CLK1 may be changed from the first low power supply voltage VGL to the first high power supply voltage VGH at the sixth time point TP6, and the first clock signal CLK1 having the first high power supply voltage VGH may be applied in a period from the sixth time point TP6 to a seventh time point TP7.

The second clock signal CLK2 may be changed from the first high power supply voltage VGH to the first low power supply voltage VGL at the seventh time point TP7, and the second clock signal CLK2 having the first low power supply voltage VGL may be applied in a period from the seventh time point TP7 to an eighth time point TP8. The second transistor T2 may be turned on in response to the voltage V-IN3 of the third node IN3 having the first low-level voltage L, and the third transistor T3 may be turned on in response to the second clock signal CLK2 having the first low-level voltage L, so that the first high power supply voltage VGH may be applied to the first node IN1 by the second and third transistors T2 and T3 so as to stabilize the voltage V-IN1 of the first node IN1 to the high-level voltage H corresponding to the first high power supply voltage VGH. In addition, the eighth transistor T8 may be turned on in response to the first low power supply voltage VGL, so that the voltage V-IN2 of the second node IN2 may also be stabilized to the high-level voltage H corresponding to the first high power supply voltage VGH. Meanwhile, the third transistor T3 may be turned on whenever the second clock signal CLK2 has the first low power supply voltage VGL so as to apply the first high power supply voltage VGH to the first node IN1 and the second node IN2.

As described above, the $k^{th}$ stage STAGE(k) may include an inputter 210 configured to transmit the input signal IN(k) to the first node IN1 in response to the first clock signal CLK1, a stress reliever 220 disposed between the first node IN1 and the second node IN2, a carry signal outputter 240 configured to receive the first high power supply voltage VGH and the second clock signal CLK2 and to output the second clock signal CLK2 as the $k^{th}$ carry signal CR(k) through the first output node ON1 in response to the voltage V-IN2 of the second node IN2, an output signal outputter 245 configured to receive the second high power supply voltage VGH2 and the third clock signal CLK3 and to output the third clock signal CLK3 as the $k^{th}$ output signal EB(k) through the second output node ON2 in response to the voltage V-IN2 of the second node IN2, a maintainer 250 configured to transmit the first clock signal CLK1 to the third node IN3 in response to the voltage V-IN1 of the first node IN1, and a stabilizer 260 configured to apply the first low power supply voltage VGL to the third node IN3 in response to the first clock signal CLK1 and to apply the first high power supply voltage VGH to the first node IN1 in response to the second clock signal CLK2.

Here, since each of the first clock signal CLK1 and the second clock signal CLK2 toggles between the first high power supply voltage VGH and the first low power supply voltage VGL, and the third clock signal CLK3 toggles between the second high power supply voltage VGH2 that is variable and the second low power supply voltage VGL2 that is variable, the scan driver 130B for applying the bias voltage may easily adjust the bias voltage VBIAS for directly or indirectly boosting the voltage of the gate terminal of the driving transistor in the pixel circuit 111 by varying the second high power supply voltage VGH2 of the third clock signal CLK3 and/or the second low power supply voltage VGL2 of the third clock signal CLK3. As a result, according to the display device 100 including the scan driver 130B for applying the bias voltage, even when the frame rate of the panel driving frame for driving the display panel 110 varies (i.e., the driving frequency of the display panel 110 varies), the hysteresis characteristics in which the characteristics of the driving transistor are fixed into a predetermined state may be improved.

Figure 15:
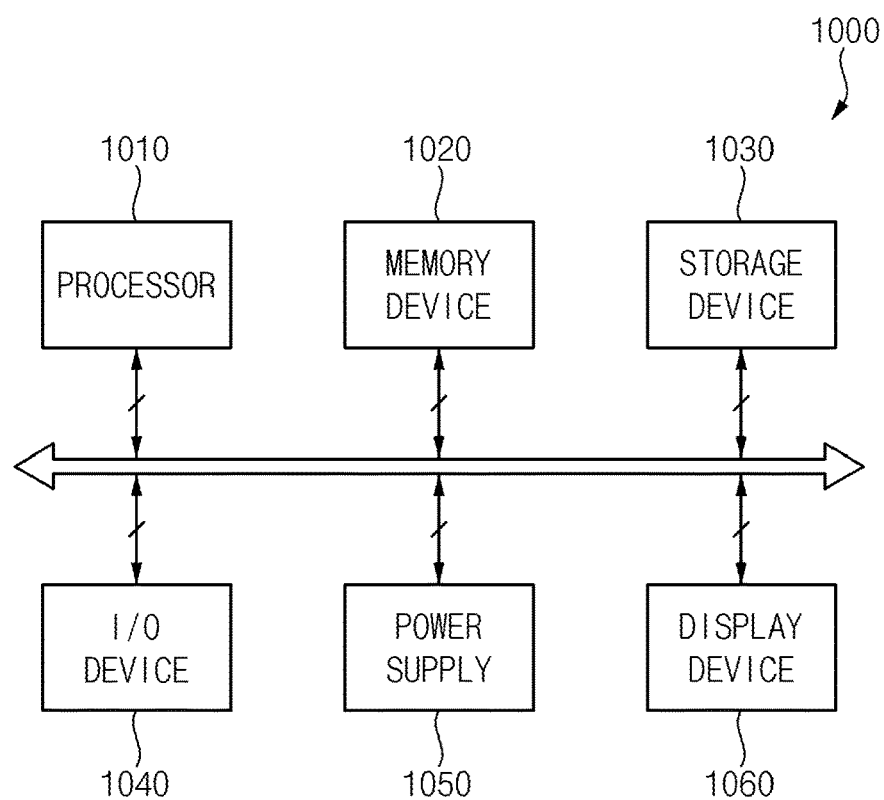
FIG. 15 is a block diagram illustrating an electronic device according to embodiments.

FIG. 15 is a block diagram illustrating an electronic device according to embodiments.

Referring to FIG. 15, the electronic device 1000 may include a processor 1010, a memory device 1020, a storage device 1030, an input/output (I/O) device 1040, a power supply 1050, and a display device 1060. Here, the display device 1060 may be the display device 100 of FIG. 1. In addition, the electronic device 1000 may further include a plurality of ports for communicating with a video card, a sound card, a memory card, a universal serial bus (USB) device, other electronic devices, and the like. For example, the electronic device 1000 may be implemented as a smart phone, a cellular phone, a video phone, a smart phone, a smart pad, a smart watch, a tablet personal computer (PC), a car navigation system, a computer monitor, a laptop, a head mounted display (HMD) device, and the like.

The processor 1010 may perform various computing functions. In an embodiment, the processor 1010 may be a microprocessor, a central processing unit (CPU), an application processor (AP), and the like. The processor 1010 may be coupled to other components via an address bus, a control bus, a data bus, and the like. Further, the processor 1010 may be coupled to an extended bus such as a peripheral component interconnection (PCI) bus.

The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like.

The storage device 1030 may include a solid state drive (SSD) device, a hard disk drive (HDD) device, a CD-ROM device, and the like.

The I/O device 1040 may include an input device such as a keyboard, a keypad, a mouse device, a touch-pad, a touch-screen, and the like, and an output device such as a printer, a speaker, and the like. In some embodiments, the I/O device 1040 may include the display device 1060.

The power supply 1050 may provide power for operations of the electronic device 1000.

The display device 1060 may display an image corresponding to visual information of the electronic device 1000. The display device 1060 may be connected to other components through the buses or other communication links. The display device 1060 may perform one display scan operation when a driving time of a panel driving frame is a reference driving time, and may perform one display scan operation and at least one self scan operation when the driving time of the panel driving frame is greater than the reference driving time. Here, the display device 1060 may include a scan driver for applying a bias voltage, which is configured to generate a bias voltage for boosting a voltage of a gate terminal of a driving transistor in a pixel circuit, so that even when a frame rate of the panel driving frame for driving a display panel varies (i.e., a driving frequency of the display panel varies), hysteresis characteristics in which characteristics of the driving transistor are fixed into a predetermined state may be improved. Accordingly, according to the display device 1060, a high-quality image may be may displayed even when a variable frame rate technology is adopted.

In an embodiment, the scan driver for applying the bias voltage may include first to $n^{th}$ stages configured to output first to $n^{th}$ output signals for applying the bias voltage to first to $n^{th}$ pixel rows, respectively. The $k^{th}$ stage among the first to $n^{th}$ stages may include an inputter configured to transmit an input signal to a first node in response to a first clock signal, a stress reliever disposed between the first node and a second node, a carry signal outputter configured to receive a high power supply voltage and a second clock signal and to output the second clock signal as a $k^{th}$ carry signal through a first output node in response to a voltage of the second node, an output signal outputter configured to receive the high power supply voltage and a third clock signal and to output the third clock signal as the $k^{th}$ output signal through a second output node in response to the voltage of the second node, a maintainer configured to transmit the first clock signal to a third node in response to a voltage of the first node, and a stabilizer configured to apply a first low power supply voltage to the third node in response to the first clock signal and to apply the high power supply voltage to the first node in response to the second clock signal. Here, each of the first clock signal and the second clock signal may toggle between the high power supply voltage and the first low power supply voltage, and the third clock signal may toggle between the high power supply voltage and a second low power supply voltage that is adjustable.

In another embodiment, the scan driver for applying the bias voltage may include first to $n^{th}$ stages configured to output first to $n^{th}$ output signals for applying the bias voltage to first to $n^{th}$ pixel rows, respectively. The first to $n^{th}$ stages may include an inputter configured to transmit an input signal to a first node in response to a first clock signal, a stress reliever disposed between the first node and a second node, a carry signal outputter configured to receive a first high power supply voltage and a second clock signal and to output the second clock signal as a $k^{th}$ carry signal through a first output node in response to a voltage of the second node, an output signal outputter configured to receive a second high power supply voltage and a third clock signal and to output the third clock signal as the $k^{th}$ output signal through a second output node in response to the voltage of the second node, a maintainer configured to transmit the first clock signal to a third node in response to a voltage of the first node, and a stabilizer configured to apply a first low power supply voltage to the third node in response to the first clock signal and to apply the first high power supply voltage to the first node in response to the second clock signal. Here, each of the first clock signal and the second clock signal may toggle between the high power supply voltage and the first low power supply voltage, and the third clock signal may toggle between the second high power supply voltage that is adjustable and a second low power supply voltage that is adjustable.

Since a structure and an operation of the scan driver for applying the bias voltage are described above, duplicated description related thereto will not be repeated.

The present disclosure may be applied to a display device and an electronic device including the display device. For example, the present disclosure may be applied to a cellular phone, a smart phone, a video phone, a smart pad, a smart watch, a tablet PC, a car navigation system, a television, a computer monitor, a laptop, a head mounted display (HMD) device, an MP3 player, etc.

The foregoing is illustrative of the disclosure and is not to be construed as limiting thereof. Although a few embodiments of the disclosure have been described, those skilled in the art will readily appreciate that many modifications are possible in the embodiments without materially departing from the novel teachings and advantages of the disclosure. Accordingly, all such modifications are intended to be included within the scope of the disclosure as defined in the claims. Therefore, it is to be understood that the foregoing is illustrative of the disclosure and is not to be construed as limited to the predetermined embodiments disclosed, and that modifications to the disclosed embodiments, as well as other embodiments can be made.

What is claimed is:

1. A scan driver for applying a bias voltage, the scan driver comprising:
   first to $n^{th}$ stages, where n is an integer of 2 or more, configured to output first to $n^{th}$ output signals for applying the bias voltage to first to $n^{th}$ pixel rows, respectively,
   wherein the $k^{th}$ stage, where k is an integer of 1 to n, includes:
     an inputter configured to transmit an input signal to a first node in response to a first clock signal;
     a stress reliever disposed between the first node and a second node;
     a carry signal outputter configured to receive a high power supply voltage and a second clock signal and to output the second clock signal as a $k^{th}$ carry signal through a first output node in response to a voltage of the second node;
     an output signal outputter configured to receive the high power supply voltage and a third clock signal and to output the third clock signal as the $k^{th}$ output signal through a second output node in response to the voltage of the second node;
     a maintainer configured to transmit the first clock signal to a third node in response to a voltage of the first node; and
     a stabilizer configured to apply a first low power supply voltage to the third node in response to the first clock signal and to apply the high power supply voltage to the first node in response to the second clock signal, and
   wherein each of the first clock signal and the second clock signal selectively toggles between the high power supply voltage and the first low power supply voltage, the third clock signal selectively toggles between the high power supply voltage and a second low power supply voltage different from the first low power supply voltage, and the bias voltage is adjusted by changing the second low power supply voltage.

2. The scan driver of claim 1, wherein the input signal includes a scan start signal or a previous carry signal.

3. The scan driver of claim 1, wherein the inputter includes:
   a first transistor having a first terminal configured to receive the input signal, a second terminal connected to the first node, and a gate terminal configured to receive the first clock signal.

4. The scan driver of claim 1, wherein the stress reliever includes:
   an eighth transistor having a first terminal connected to the first node, a second terminal connected to the second node, and a gate terminal configured to receive the first low power supply voltage.

5. The scan driver of claim 1, wherein the carry signal outputter includes:
   a ninth transistor having a first terminal configured to receive the high power supply voltage, a second terminal connected to the first output node, and a gate terminal connected to the third node; and
   a tenth transistor having a first terminal connected to the first output node, a second terminal configured to receive the second clock signal, and a gate terminal connected to the second node.

6. The scan driver of claim 1, wherein the output signal outputter includes:
   a sixth transistor having a first terminal configured to receive the high power supply voltage, a second terminal connected to the second output node, and a gate terminal connected to the third node; and
   a seventh transistor having a first terminal connected to the second output node, a second terminal configured to receive the third clock signal, and a gate terminal connected to the second node.

7. The scan driver of claim 1, wherein the maintainer includes:
   a fourth transistor having a first terminal connected to the third node, a second terminal configured to receive the first clock signal, and a gate terminal connected to the first node.

8. The scan driver of claim 1, wherein the stabilizer includes:
   a second transistor having a first terminal configured to receive the high power supply voltage, a second terminal, and a gate terminal connected to the third node;
   a third transistor having a first terminal connected to the second terminal of the second transistor, a second terminal connected to the first node, and a gate terminal configured to receive the second clock signal;
   a first capacitor having a first terminal configured to receive the high power supply voltage and a second terminal connected to the third node; and
   a fifth transistor having a first terminal connected to the third node, a second terminal configured to receive the first low power supply voltage, and a gate terminal configured to receive the first clock signal.

9. The scan driver of claim 1, further comprising:
a bootstrapper disposed between the second node and the first output node.

10. The scan driver of claim 9, wherein the bootstrapper includes:
a second capacitor having a first terminal connected to the second node and a second terminal connected to the first output node.

11. A scan driver for applying a bias voltage, the scan driver comprising:
first to $n^{th}$ stages, where n is an integer of 2 or more, configured to output first to $n^{th}$ output signals for applying the bias voltage to first to $n^{th}$ pixel rows, respectively,
wherein the $k^{th}$ stage, where k is an integer of 1 to n, includes:
an inputter configured to transmit an input signal to a first node in response to a first clock signal;
a stress reliever disposed between the first node and a second node;
a carry signal outputter configured to receive a first high power supply voltage and a second clock signal and to output the second clock signal as a $k^{th}$ carry signal through a first output node in response to a voltage of the second node;
an output signal outputter configured to receive a second high power supply voltage different from the first power supply voltage and a third clock signal and to output the third clock signal as the $k^{th}$ output signal through a second output node in response to the voltage of the second node;
a maintainer configured to transmit the first clock signal to a third node in response to a voltage of the first node; and
a stabilizer configured to apply a first low power supply voltage to the third node in response to the first clock signal and to apply the first high power supply voltage to the first node in response to the second clock signal, and
wherein each of the first clock signal and the second clock signal selectively toggles between the first high power supply voltage and the first low power supply voltage, the third clock signal selectively toggles between the second high power supply voltage and a second low power supply voltage different from the first low power supply voltage, and the bias voltage is adjusted by changing at least one of the second high power supply voltage and the second low power supply voltage or by changing the second high power supply voltage and the second low power supply voltage simultaneously.

12. The scan driver of claim 11, wherein the input signal includes a scan start signal or a previous carry signal.

13. The scan driver of claim 11, wherein the inputter includes:
a first transistor having a first terminal configured to receive the input signal, a second terminal connected to the first node, and a gate terminal configured to receive the first clock signal.

14. The scan driver of claim 11, wherein the stress reliever includes:
an eighth transistor having a first terminal connected to the first node, a second terminal connected to the second node, and a gate terminal configured to receive the first low power supply voltage.

15. The scan driver of claim 11, wherein the carry signal outputter includes:
a ninth transistor having a first terminal configured to receive the first high power supply voltage, a second terminal connected to the first output node, and a gate terminal connected to the third node; and
a tenth transistor having a first terminal connected to the first output node, a second terminal configured to receive the second clock signal, and a gate terminal connected to the second node.

16. The scan driver of claim 11, wherein the output signal outputter includes:
a sixth transistor having a first terminal configured to receive the second high power supply voltage, a second terminal connected to the second output node, and a gate terminal connected to the third node; and
a seventh transistor having a first terminal connected to the second output node, a second terminal configured to receive the third clock signal, and a gate terminal connected to the second node.

17. The scan driver of claim 11, wherein the maintainer includes:
a fourth transistor including a first terminal connected to the third node, a second terminal configured to receive the first clock signal, and a gate terminal connected to the first node.

18. The scan driver of claim 11, wherein the stabilizer includes:
a second transistor having a first terminal configured to receive the first high power supply voltage, a second terminal, and a gate terminal connected to the third node;
a third transistor having a first terminal connected to the second terminal of the second transistor, a second terminal connected to the first node, and a gate terminal configured to receive the second clock signal;
a first capacitor having a first terminal configured to receive the first high power supply voltage and a second terminal connected to the third node; and
a fifth transistor having a first terminal connected to the third node, a second terminal configured to receive the first low power supply voltage, and a gate terminal configured to receive the first clock signal.

19. The scan driver of claim 11, further comprising:
a bootstrapper disposed between the second node and the first output node.

20. The scan driver of claim 19, wherein the bootstrapper includes:
a second capacitor having a first terminal connected to the second node and a second terminal connected to the first output node.

21. A display device comprising:
a display panel including first to $n^{th}$ pixel rows, where n is an integer of 2 or more, including pixel circuits having a structure in which a bias voltage is applied to a gate terminal of a driving transistor through a boosting capacitor;
a display panel driver configured to drive the display panel; and
a scan driver for applying a bias voltage, which includes first to $n^{th}$ stages configured to output first to $n^{th}$ output signals for applying the bias voltage to the first to $n^{th}$ pixel rows, respectively,
wherein the bias voltage corresponds to a difference between a high-level voltage and a low-level voltage of the $k^{th}$ output signal, where k is an integer of 1 to n, and the bias voltage is adjusted by changing at least one of the high-level voltages and the low-level voltage or by changing the high-level voltage and the low-level voltage simultaneously.

22. The display device of claim 21, wherein the k$^{th}$ stage includes:
- an inputter configured to transmit an input signal to a first node in response to a first clock signal;
- a stress reliever disposed between the first node and a second node;
- a carry signal outputter configured to receive a high power supply voltage and a second clock signal and to output the second clock signal as a k$^{th}$ carry signal through a first output node in response to a voltage of the second node;
- an output signal outputter configured to receive the high power supply voltage and a third clock signal and to output the third clock signal as the k$^{th}$ output signal through a second output node in response to the voltage of the second node;
- a maintainer configured to transmit the first clock signal to a third node in response to a voltage of the first node; and
- a stabilizer configured to apply a first low power supply voltage to the third node in response to the first clock signal and to apply the high power supply voltage to the first node in response to the second clock signal, and
- wherein each of the first clock signal and the second clock signal toggles between the high power supply voltage and the first low power supply voltage, the third clock signal toggles between the high power supply voltage and a second low power supply voltage different from the first low power supply voltage, and the bias voltage is adjusted by changing the second low power supply voltage.

23. The display device of claim 22, wherein the input signal includes a scan start signal or a previous carry signal.

24. The display device of claim 21, wherein the k$^{th}$ stage includes:
- an inputter configured to transmit an input signal to a first node in response to a first clock signal;
- a stress reliever disposed between the first node and a second node;
- a carry signal outputter configured to receive a first high power supply voltage and a second clock signal and to output the second clock signal as a k$^{th}$ carry signal through a first output node in response to a voltage of the second node;
- an output signal outputter configured to receive a second high power supply voltage different from the first high power supply voltage and a third clock signal and to output the third clock signal as the k$^{th}$ output signal through a second output node in response to the voltage of the second node;
- a maintainer configured to transmit the first clock signal to a third node in response to a voltage of the first node; and
- a stabilizer configured to apply a first low power supply voltage to the third node in response to the first clock signal and to apply the first high power supply voltage to the first node in response to the second clock signal, and
- wherein each of the first clock signal and the second clock signal selectively toggles between the first high power supply voltage and the first low power supply voltage, the third clock signal selectively toggles between the second high power supply voltage and a second low power supply voltage different from the first low power supply voltage, and the bias voltage is adjusted by changing at least one of the second high power supply voltage and the second low power supply voltage or by changing the second high power supply voltage and the second low power supply voltage simultaneously.

25. The display device of claim 24, wherein the input signal includes a scan start signal or a previous carry signal.

* * * * *